United States Patent [19]
Wang et al.

[11] Patent Number: 5,557,773
[45] Date of Patent: Sep. 17, 1996

[54] COMPUTATIONAL AUTOMATION FOR GLOBAL OBJECTIVES

[76] Inventors: Cheh C. Wang; Esther C. M. Wang, both of 1479 San Marcos Dr., San Jose, Calif. 95132-2262

[21] Appl. No.: 326,655

[22] Filed: Oct. 19, 1994

Related U.S. Application Data

[63] Continuation-in-part of Ser. No. 714,243, Jun. 12, 1991, abandoned.

[51] Int. Cl.$^6$ .................................................. G06F 17/18
[52] U.S. Cl. ................... 395/500; 364/286.2; 364/285.4; 364/262.1; 364/259.2; 364/DIG. 1
[58] Field of Search .................................. 395/500, 800, 395/183.09

[56] References Cited

U.S. PATENT DOCUMENTS

| | | | |
|---|---|---|---|
| 4,786,908 | 11/1988 | Runnalls | 342/63 |
| 5,148,379 | 9/1992 | Konno | 364/578 |
| 5,195,172 | 3/1993 | Elad | 395/50 |

*Primary Examiner*—Eric Coleman

[57] ABSTRACT

A method has been established for dealing with computational automation for global objective that pursues the final purpose of computation rather than the computations alone. The global objective programming allows users to use simple symbolic-numeric input to access the flexible usage of solvers for multiple purposes. It enables various levels of computer automation in procedural objective tasks and computational objective tasks to be executed separately or combinatively under very simple common rules of symbolic-numeric statements input at run time. This kind of automation is vital in tapping the enormous power, credibility, and reliability of computers for computation. Needless manual effort that doesn't contribute to the better understanding of analyses, tends to contribute to inefficiency at best, and provide the excuse of "to err is human" at worst. The user-involved-flexible-computational-automation offers users the opportunities to understand the key issues for solutions being sought, the power to question the computer's results, and the leeway to see the computer's own proofs. In this way, the goal to make designers regain their analytical tools and engineers to restore their engineering confidence in the computer age can be placed within comfortable reach.

5 Claims, 24 Drawing Sheets

```
C MAIN PROGRAM--typical common requirement SHARED
C by all programs--ALL FILE NAMES ARE DUMMYS
      OPEN(UNIT=1,FILE='Y1.DAT',STATUS='UNKNOWN')      ~330
      OPEN(UNIT=2,FILE='S1.LOG',STATUS='UNKNOWN')      ~331
      OPEN(UNIT=3,FILE='IN1.DAT',STATUS='UNKNOWN')     ~332
      OPEN(UNIT=4,FILE='IM1.DAT',STATUS='UNKNOWN')     ~333
      OPEN(UNIT=7,FILE='IM1.SCR',STATUS='UNKNOWN')     ~334
      OPEN(UNIT=8,FILE='IM.PLT',STATUS='UNKNOWN')      ~335
         . . .                                          ~336
         . . .
      CALL TITLE
      CALL READFILE(IRR)                                ~337
      IF(IRR.EQ.1) CALL CLEAR
      REWIND 2
      REWIND 3
      REWIND 4
         . . .
         . . .
      CALL MENU(0)
      END
```

| | |
|---|---|
| REM TYPICAL BATCH QUEUE DRIVER | |
| COPY IM1.SCR SSS1.LOG | ~340 |
| ECHO OFF | |
| %1<SSS1.LOG | ~341 |
| REM POSTPROCESSOR INTERFACE FORMAT STD E18.10 | ~342 |
| CVFIL5<br>AUTOPLT5 | ~343 |

EXEC  2                                                    ~356

1
1.00         5.00           5.00
1.00         1.00           1.00
1.00         1.00           1.00
1.E-009      1
2  3  0  0   0  11  13  0  0  0  10  2  2
X1R    X2R
       4
EXEC  2

.
       .                                                   ~357
       .

1
1.00         13.00          13.00
1.00         1.00           1.00
1.00         1.00           1.00
1.E-009      1
2  3  0  0   0  11  13  0  0  0  10  2  2
X1R    X2R
       4
EXEC  2

| | |
|---|---|
| SYMBOLIC-NUMERIC INPUT UPDATE AND HUMAN-MACHINE COMMUNICATION | 401 |
| CONVERTING DRAWING REQUIREMENTS INTO INPUT REQUIREMENTS. (e.g. AUTOMATIC MATH MODELING) | 402 |
| PARAMETRIC STUDY | 403 |
| OPTIMIZATION | 404 |
| EQUAL STRENGTH CALCULATION | 405 |
| DATA SWITCH FROM ONE GROUP TO ANOTHER | 406 |
| ALTERNATIVE SOLUTIONS | 407 |
| SAFETY ASSURANCE OPTIONS | 408 |
| EXAMINATION WINDOW FOR SOLUTION QUALITY | 409 |
| OTHER OBJECTIVE TASKS | 410 |
| COMPUTER AIDED DATA CHECK | 411 |

| THE AVAILABLE INPUT OPTIONS | SEQUENTIAL WITH SWITCH | ~421 |
| --- | --- | --- |
| | SYMBOLIC-NUMERIC INPUT (COMPUTER-AIDED) | ~422 |
| | FREE SYMBOLIC-NUMERIC INPUT FORM VARIABLE UPDATE TO CONVEYING GENERAL MEANING OF USER'S INTENTION. | ~423 |

| SEQ'L INPUT SWITCH | 0 | INTERACTIVE MODE | ~424 |
| --- | --- | --- | --- |
| | 1 | MACHINE INPUT MODE | ~425 |

| THE AVAILABLE TASK FORMS | SIMPLE -- FOR DOING ONLY ONE TASK A TIME | 426 |
| --- | --- | --- |
| | COMBINATIVE -- FOR DOING MULTIPLE TASKS, ONE AFTER ANOTHER PER QUEUE OPTION | 427 |
| | DERIVATIVE -- TO GENERATE ERROR FREE INPUT FOR AS MANY CASES AS ONE WISHES FOR AUTOMATIC EXECUTION OF PARAMETRIC STUDY (OR DOMAIN ANALYSIS) AMONG A LIST OF SOLVERS AVAILABLE | 428 |

FIG. 4c

| THE AVAILABLE OUTPUT OPTIONS | DEFAULT -- CONVENTIONAL | 429 |
| --- | --- | --- |
| | SELECTIVE -- USERS TO MAKE DISCRETION AT RUN-TIME TO OVERRIDE THE DEFAULT | 430 |

FIG. 4d

| | | |
|---|---|---|
| THE AVAILABLE SOLUTION OPTIONS | DEFAULT--CONVENTIONAL | ~431 |
| | ALTERNATIVE (ONE OR MORE) | ~432 |
| | TRANSPARENT BOX FOR USER'S INSPECTION (IF BENEFIT JUSTIFIES) | ~433 |

FIG. 4e

| | | |
|---|---|---|
| AVAILABLE OBJECTIVE TASKS FUNCTION LEVELS | SIMPLISTIC-- SUCH AS "LIST", "QUIT", "EXECUTE", ... | ~434 |
| | STATIC AUTOMATION--WITH PREDETERMINED LOOPING REQUIREMENT, LIKE "PARAMETRIC STUDY" | ~435 |
| | DYNAMIC AUTOMATION--WITH LOOPING REQUIREMENT BASED ON LOGICAL AND NUMERIC CONSTRAINTS, LIKE "OPTIMIZATION" OR "EQUAL-STRENGTH" | ~436 |

FIG. 4f

| PLEASE CHOSE ONE OF THE DESIRED INPUT TASKS: | | |
|---|---|---|
| TASK 1 | SEQUENTIAL ORDER (CONVENTIONAL) INPUT. | 501 |
| TASK 2 | RANDOM ORDER (SYMBOLIC+NUMERIC) INPUT. | 502 |
| TASK 3 | LIST CURRENT INPUT DATA. | 503 |
| TASK 4 | PARAMETRIC STUDY, DIRECT INPUT REVISION & OBJECT TASK AUTOMATION. | 504 |
| TASK 5 | MAIN PROGRAM EXECUTION. | 505 |
| TASK 6 | OPTIONAL SOLUTION WITH ALTERNATIVE THEORY & METHODS. | 506 |
| TASK 7 | ERASE OLD FILES, STARTING NEW PROJECT (OPTIONAL) | |
| TASK 8 | EXIT THE PROGRAM. | |
| ENTER TASK NO. ==> | | |

FIG. 5

THE FOLLOWING OPTIONS ARE AVAILABLE IN SOLUTIONS:

1. BY SINGLE PRECISION AND CONVENTIONAL FORMULA;
2. BY DOUBLE PRECISION AND CONVENTIONAL FORMULA;
3. BY SINGLE PRECISION AND NON-CONVENTIONAL FORMULA;
4. BY DOUBLE PRECISION AND NON CON-CONVENTIONAL FORMULA;
5. BY MEANS OF PHYSICAL EVENT SIMULATION IN SINGLE PRECISION ARITHMETICS;
6. BY MEANS OF PHYSICAL EVENT SIMULATION IN DOUBLE PRECISION ARITHMETICS;
7. TO ALLOW NEW INPUT;
8. TO OPEN SYMBOLIC-NUMERICAL CHANNEL OF COMMUNICATION'
9. TO RETURN TO MAIN MENU.

PLEASE ENTER YOUR CHOICE:

FIG. 6a

NUMERICAL EXAMINATION PER EXACT THEORY OF TROCHOIDAL ENVELOPE
GENERATION PROCESS--FOUR OPTIONS ARE AVAILABLE FOR STUDYING

1. BISECTION METHOD--BISEC. RATIO IS UNDER USER'S CONTROL;
2. NEWTON-RAPHASON METHOD--ENTRY POINT IS UNDER USER'S CONTROL;
3. EXPLORATION OF MAX. OBTAINABLE NUMBER OF SIGNIFICANT DIGITS OF
   RESULT BY MEANS OF APPLYING BISECTION METHOD TO THE ULTIMATE
   LIMIT;
4. INCREMENTAL FUNCTION EVALUATIONS ZOOM AT SPECIFIC INTERVAL
   CONTROLLED BY USERS;
5. RETURN TO MAIN MENU.

PLEASE ENTER SELECTION (ENTER 1,2,3,4, OR 5) -->

FIG. 6b

```
ICL=20; ICN ARRAY=0 0 0 0 0 0 0 0 0 0 0 0 0 0 0 0 0 0 0 0

THE INPUT VARIABLES REMAINED TO BE INPUT ARE:

IG   IL   IT   N1   N2   NC   MN   PHIN   SI    CR
F    RO1  RO2  X    X0   HAO  RAO  DL0    DSN   EPS

PLEASE ENTER SYMBOLIC+NUMERICAL INPUTS OR EXPRESS-TASK COMMAND:
Separate symbol and number with Space, Comma, or Equal-Sign:==>

IG 1 IL 1 IT 1

G 1 IL 1 IT 1
**IG 1 IL 1 IT 1

G 1 IL 1 IT 1
   QLTY =       1            1.00000000
   QLTY =       2            1.00000000
   QLTY =       3            1.00000000
   NAME =       1            IG
   NAME =       2            IL
   NAME =       3            IT

THE PARAMETERS WHICH REMAIN TO BE ENTERED ARE:
N1  N2   NC   MN   PHIN  SI   CR    F    RO1 RO2
X   X0   HAO  RAO  DL0   DSN  EPS

PLEASE ENTER SYMBOLIC+NUMERICAL INPUTS OR EXPRESS-TASK COMMAND:
Separate symbol and number with Space, Comma, or Equal-Sign:==>
```

```
C Navier's Solution for Simply Supported Rectangular Plate
C under A Concentrated Load.  A force P applied at [X0,Y0]
C of  A x B, thickness H, taking first J terms of infinite
C series, for grid div. K x K, and E=modulus of elasticity
C U=Poisson's ratio, the solution established since 1820.
      REAL*4 W1(5001)
      WF(X,Y)=SIN(M*PI*X0/A)*SIN(N*PI*Y0/B)*SIN(M*PI*X/A)*
     1SIN(N*PI*Y/B)/((M/A)**2+(N/B)**2)**2*CP
      PRINT *,'  INPUT A,B,X0,Y0,P,H,E,U,J,K: '
      OPEN (UNIT=2,FILE='PLATE.OUT',STATUS='UNKNOWN')
      READ(5,*)  A,B,X0,Y0,P,H,E,U,J,K
      PI=4.*ATAN(1.)
      DX= A/K
      DY= B/K
      D=E*H**3/(12.0*(1.0-U**2))
      CP=4.*P/((PI**4)*A*B*D)
      DO 1000 L=2,K
      Y1=(L-1)*DY
      DO 1001 I=1,K+1
 1001 W1(I)=0.
      DO 1002 I=2,K
      X1=(I-1)*DX
      DO 100 M=1, J
      DO 10 N=1, J
      DW=WF(X1,Y1)
   10 W1(I)=W1(I)+DW
  100 CONTINUE
 1002 CONTINUE
      WRITE(2,50) (W1(I1),I1=1,K+1)
 1000 CONTINUE
   50 FORMAT (1X,5(F14.6,1X))
      END
```

```
     NASTRAN:     11592.97

Navier's Method:  11593.53(30)

COMPUTATIONAL AUTOMATION FOR GLOBAL OBJECTIVES

This is a continuation-in-part of Ser. No. 07/714,243 filed Jun. 12, 1991, now abandoned.

REFERENCES CITED

U.S. PATENT DOCUMENTS 4,841,479, June 1989, Tsuji et al, 395/500
4,819,161, April 1989, Konno et al, 364/191
3,840,725, October 1974, Grezdov et al, 364/601
5,129,035, July 1992, Saji et al, 395/1
4,972,334, November 1990, Yamabe et al, 395/500
5,148,379, September 1992, Konno et al, 364/578
5,195,172, March 1993, Elad et al, 395/50
4,786,908, November 1988, Runnalls et al, 342/63

OTHER PUBLICATIONS

Committee on Science, Space, and Technology, U.S. House of Representatives, 101th Congress, Investigation Report: "Bugs in The Program—Problems in Federal Government Computer Software Development and Regulation", U.S. Government Printing Office, September 1989.

Wilson, E. L., SMIS, Symbolic Matrix Interpretive System, University of California, Berkeley, Report No. UCS-ESM 73-3, 1973; CAL—Computer Analysis Language for The Static and Dynamic Analysis of Structural Systems, U.C., Berkeley, January 1977.

Wang, C. C., "Abstract Mathematical Modeling in Mechanical Design Application," Proceedings, The First China-Japan International Symposium on Machine Elements, CJISME-93, International Academic Publishers, 1993 Wang, C. C., "On Software Verification, Limitation and Classification for Computational Safety Objective", Computers in Engineering 1988, ASME, 1988.

Yee, H. C. et al, "Dynamical Approach Study of Spurious Steady-State Numerical Solutions of Nonlinear Differential Equations: II, III, and IV", NASA Technical Reports, Ames Research Center, Moffett Field, Calif. 1992.

Cody, W. J., "The Evaluation of Mathematical Software", Program Test Methods, edited by W. C. Hetzel, pp. 121–133, Prentice-Hall, 1973.

Roesset, J. M., "Chapter 19: Soil Amplification of Earthquake", Numerical Methods in Geotechnical Engineering, Desai, C. S. and Christian, J. T., editors, pp. 680–681, McGraw-Hill, 1977.

The Department of Defense, FY-1993 Defense SBIR Program Solicitation Topic No. A93-004: "Technology Affordability", DoD, 1993.

BACKGROUND OF THE INVENTION

1. Field of Invention

This invention relates to a method of generating a numerical calculation program for engineering analyses. It differs from conventional programming habits by offering extra precautions and extensions to each respective solution method to help users to achieve better computations than existing methods can. The applications aim to reduce procedural barriers in modern computations to enable persons (such as designers) who need the tool to use them safely. The flexible computational automation is found to be comfortably within the ability of casual users. The method provides greatly enhanced computing power to help users to reclaim their roles not only as qualified modern analytical tool users, but also as ones who can indeed supervise computer's results intelligently with the scientific means provided. The invention is also applicable to the fields of program tests, program comparisons, and computational trap education.

DESCRIPTION OF THE RELATED ART AND BACKGROUND OF THE INVENTION.

Ancient Wisdom Revisited—The Rationale For A Better Kingdom. Human wisdom before Christ contributed the following lines in an old Chinese script Meng-tse (by Mencius, 372–289 B.C., the greatest Chinese thinker after the time of Confucius, 551–479 B.C.):

"According to the rationale of Hsi-tse: 'If there were no second market price, the country will be free from deceit. Then, even young kids can go to market, without fear to be cheated if the rules for prices are set: Cloth, same length for same price; flax, cotton, silk, processed or not, same weight for same price; cereals of any kind, same grain measure for same price; shoes, same size for same price.' Mencius said: 'The non-uniformity of things is the way of nature, one may worth two to five times, or ten to one hundred times, or one thousand to ten thousands times, of the other. Hsi-tse treated them all equal is to muddle things under the heaven. Even big shoes and small shoes of same price won't do, how could the equal price regardless of quality be a way for people to shun away from deceit? Per Hsi-tse's rules, people will rush towards, one after another, taking advantage of lawful deceptions. How could a kingdom be ruled?'"

Comparing the ancient thought with the today's reality, we found a striking similarity in today's practice and Hsi-tse's rationales so far as compensation for engineering design and analysis effort is concerned. That is, because of the lack of a measurement for quality and efficiency for intellectual effort in computer age, the measurement per the old pre-computer age scale is continually honored. The rule of equal hours equal pay for comparable ranks of personnel for doing similar activities was acceptable in the pre-computer age for rewarding the effort of design and analysis. Keeping the same old rule in the computer age can run into a far bigger problem by direct extension of Mencius's warning made more than 2300 years ago. That is, could society really afford to ignore the difference in quality of workmanship generated by computer usage one way or another? We rephrase Mencius's viewpoint for today's reality: the intellectual efforts differing by two times to infinite times in usefulness or uselessness in computer age are the mother nature of computing. Treating inferior and elegant effort as equal according to the labor hours or computer hours spent, practically creates a negative incentive that rewards poor quality. Per Mencius' view, this will cause people to rush, one after another, towards taking advantage of lawful deceptions. How could a democracy be ruled?

A tiny program that brings the idea of 19th century's human wisdom back to life is used to show the consequence which Mencius said: "How could the kingdom be ruled?" In FIGS. 8x series, 8a shows program code; 8b shows two cases of input data; 8c shows the comparisons of results at a particular point of interest as a function of number of terms taken from infinite double Fourier's series of Navier's solution, and of the result obtained from an NASTRAN (an authoritative finite element analysis package for large scale engineering computations in commercial market) demo example run.

In FIG. 8b, the first line will generate grid divisions in terms of 20 by 20 equal spacing and find deflections of plate for all grid positions, the second line deals with the same case except the grid division is refined from 20 by 20 to 1000 by 1000. The first line input has a corresponding finite element demo example in PC/NASTRAN (1992) (now SSS/NASTRAN, trademark of Schaeffer Software Systems) to compare with. FIG. 8c shows results comparison between NASTRAN finite element method and Navier's Method. It is worth to point out that the Navier's solution which is in single precision and takes the first 30 terms for approximating the infinite double Fourier's series is in good agreement with NASTRAN's results.

However, there are significant differences in input requirement between a tiny special purpose program and a powerful general purpose finite element program. The input for NASTRAN when printed in full as shown in demo program was 114 pages data describing a math model, namely, a 20 by 20 grid division of a simply supported rectangular plate under a concentrated load. The need of many pages of input data reflects the strength when such enormous flexibility represents enormous power. But it becomes a burden when one doesn't need such generality. For now, only the fact that 114 pages of input listings corresponding to the first line of FIG. 8b is of interest. This difference is surprising but it is tolerable for the price of generality. However, the comparison of the second line with the expected NASTRAN's input counterpart turns the virtue of generalization into an unaffordable burden. That is, if the second line in FIG. 8b's NASTRAN input counterpart be printed, the listings of math model input data in NASTRAN format, sorted plus unsorted, will fill about one quarter million pages by estimation. A comment is now in order: In order to change input from case 1 to case 2 for two alternative methods, one only needs to change the last input number from 20 to 1000. However, for the other changes defy imagination. The difference between the two in a physical sense is straight forward; a 20 by 20 versus a 1000 by 1000 grid divisions in math model of a plate. The lessons learned from there, are not limited to the length of input data alone. The capacity limitations of file editor, computer, and finite element programs all become an issue to handle a math model of 1001×1001=1,002,001 grid points. Yet the tiny program can deal with much large sized problems (which is only limited by the dimension statements) with ease and confidence. When the program's array W1 has a dimension of 5001 it limits the problem size to 5001×5001=25,010,001 grid points. This can be solved on a personal computer. With this statistics, a conclusion can be drawn: This is why engineers must learn to live with engineering insight and not just manage computer input and output. If this condition is met, computers can offer immensely great benefits. If not, just the effort to meet the syntactically correct input requirement alone for large scale computation isn't easy; to make a math model truly make sense is far more difficult; to make unaffordable costs affordable, and doubtful outcomes certain would be like a fairy tale. Therefore, in the manual computation age there was no big engineering fiasco. In the computer age the reverse is true. It was because computer's enormous power to save or to waste is up to people. The example is given only for convenience of explanation. What human wisdom and computer together can do are unlimited. One of the proven practice in more general nature was offered by Wang (ref. 1993). Many trap prone methods further aggravate the situation without warning and without users' knowledge. Therefore, what we face now is not an occasional incident, but a chronic trend. This trend eventually will determine whether the computer age is an age of enormous prosperity for mankind, or just an age of man-made misery caused by the foolishness and selfishness induced incentive, or incentive induced foolishness and selfishness. Whatever it is, the ability to understand one's own tool is a key towards the right direction in computing!

The evolution of computer aided engineering programs across various engineering fields advances at increasingly rapid pace, yet the treatment on the most vital issue that affects the ultimate objective of engineering analysis remains in stagnation. What nominally a program can do continually dominates the center of both users' and developers' attention. A typical analytical software disclaimer read: "Users must verify their own results". This allows software developers to avoid dealing with known troublesome issues, even though very few users could really cope with such requirement. In reality the warnings are simply ignored or coped with by various irrational measures that simply aggravate the pain. As to the scope of computational automation, the common practice continues to shun away from dealing with those high cost and labor intensive ones. Changing this trend is possible, but computational automation must be pursued in a way that can make unaffordable affordable as pre-condition.

Flexible computational automation can ease operation training, cut down procedural effort and labor costs, enhance the reliability, and help users gain better analytical understanding. Quick professional growth depends on one's ability to grow wiser with time. Tools, that merely provide final results without providing confidence, are difficult to nurture the technical insight required to curb enormous wastefulness or to tap enormous saving through human creativity. Therefore, in the process to derive a solution, the flexible automation is a better compromise to avoid the tedious operation that won't help insight; meanwhile, it allow users to keep track of what computer is doing through meaningful numerical experimentation. Such user experimentation is important. Even a very primitive slide rule can help engineers to gain a great deal of engineering confidence through careful usage. This justifies a need to introduce flexible automation to help user's gain insight by keeping the user's mind busy in making decisions on the good use of computing power so readily available.

The relationship between design and analysis was studied repeatedly to confirm the harm of separating design and analysis. A national panel consisting of a nine member committee on engineering and design task force chaired by D. W. Ver Planck completed a report in 1958, an aftermath at the dawn of the space race after the launching of Sputnik, found that: "The functions of both engineering analysis and design rarely occur separately, but merge into one another." Such a view was reiterated by a new study coordinated by D. L. Evans, published in the special issue of Engineering Education of ASEE, July/August 1990. The fact that industry can not afford to take away designer's analytical tools has long been recognized, but nothing positive can be done.

A spectacular example will tell the reason why. The non-coordination under the policy of "designers design and analyst compute" (a policy seen as way to cope with liability law in view of lawyers and judge, tends to produce far more harm than good) has produced gridlock in real life as expected. A real R&D project aiming to cut equipment weight by half without changing its capacity ran into an argument between designers and analysts: who should come up with something first? This led to long stand off and delay. To end the gridlock became even more bizarre than the gridlock itself. As a compromise, a wooden model that was initially built based on artist's imagination finally became the basis of making both drawings and math model for large scale finite element computations. Thus, in such an event, the computations become a part of creative paper work to justify the fulfillment of contract per legal terms. However, per engineer's perspective, such kind of safety destines to waste effort regardless of project size and how big a team is. This incident also demonstrates the far reaching consequence that when only very few are accessible to modern computing tools, the honor system simply won't work. Because what a nice modern computer can do is one thing, what a balance of power needed to make any effort accountable is quite another.

The complaint of high design cost and low reliability is no longer a criticism but a fact that justifies counter measures. A research subject: "Technology Affordability" included in the January 1993 DoD's SBIR research solicitation has proven such a need. Eight research contracts were announced as to be issued simultaneously to signify the enormous importance of this undertaking.

The computer programming and application crises were investigated by the Committee on Science, Space, and Technology, U.S. House of Representatives in the mid 80's and ended with a report entitled "Bugs in The Program—Problems in Federal Government Computer Software Development and Regulation" published in 1989. The report officially marked the software issue with the term of "crisis". The following excerpt was taken from the summary of the report: "The lack of progress in developing methods for evaluating software inhibits the full confidence that would come with an analysis based on mathematics. Development of such capacity will be important in allowing agency staff to fulfill their regulatory responsibilities in the area of software . . . . Nothing recommended in this report will have any effect on the software problem in the absence of people with the capacity to understand the rationale behind them and implement them. Early tremors are being felt that suggest those are the people the Government is most likely to lose in the future. Should that occur, the problem now will seem minor by comparison."

A more basic issue than anything else has been raised recently: "Why the use of remarkable tool of the computer has failed to raise world standard of living?" Among opinions expressed in this area, the article entitled "Zero-to-60 in 5 nanoseconds", by T. Taylor, a Stanford economist, seemed to show the most explicit clue that economists can possibly arrive. He said: ". . . but the academic argument over computers and productivity has a real-world lesson. Too many people buy computers (and other new technology) the way they buy cars: paying for zero-to-60 in five second, and the ability to drive 140 mph, and other features that they will probably never use." (San Jose Mercury, May 28, 1993).

Briefly speaking, keen attention on the subject of computer aided automatic computations has been concentrated on the benefits achievable from each of the individual solvers under consideration. For example, Tsuji et al (U.S. Pat. No. 4,841,479 June 1989) dealt with automatic generation of computer simulation programs with partial differential equation and boundary conditions as input. Konno et al (U.S. Pat. No. 4,819,161 April 1989) dealt with automatic generation of simulation programs with the aid of the finite element method to convert partial differential equations input into a set of equivalent simultaneous linear equations for the ease of achieving numerical results. Grezdov et al (U.S. Pat. No. 3,840,725 October 1974) solved non-linear programming problem with the combined power of digital and analog computing. With the help of digital to analog, and analog to digital converters, the benefits from the two merged into one to help solving initial condition dependent nonlinear problems was realized. Saji et al (U.S. Pat. No. 5,129,035 July 1992) dealt with the method of generating a numerical calculation program which simulates a physical phenomenon represented by a partial differential equation. The numerical divergence resulting from the nature of the finite difference method can be avoided if the judgement of finite difference element size is controlled by the volume of discretization. Yamabe et al (U.S. Pat. No. 4,972,334 November 1990) dealt with the automatic generation method of a simulation program for numerically solving a partial differential equation according to a boundary-fitted method. The boundary problem is a troublesome task to be specified in solving a partial differential equation. Thus, when mathematical transformation rules are established to turn an arbitrary shape in real space into a regular one in normalized mathematical space, the degree of difficulties can be reduced through such mathematical maneuvers. Konno et al (U.S. Pat. No. 5,148,379, September 1992) made use of Symbolic interpreter to help simplify the FORTRAN code writing and facilitate the debugging finite difference solution schemes. Such schemes can be written into a relatively compact form to convey user's requirement and through translation subroutine to call appropriate FORTRAN subroutine for iterative solving partial differential equations with various finite difference schemes. Konno et al stayed otherwise completely within the customary domain of computation. They didn't extend their automatic computation to the most beneficial area to cope with computational traps beyond the debugging stage. Elad et al (U.S. Pat. No. 5,195,172, March 1993) applied artificial intelligence techniques, taking advantages of symbolic-numeric capability to ease the determination of constraint problems where rigorous analytical relationships are unknown or difficult to be established while seeking for solution of linear and nonlinear optimization of a system. Therefore, their invention focuses its interests in a rather specific area outside the well defined analytical domain. The key concerns of the latter are not the speed of logical deductions or computations, but rather a matter of spurious solutions coming out of digital computation's mother nature itself when right formulas and right logic fail to reach right answers. Speed factor plays no role in such events. Like other symbolic-numeric programmers, Elad et al applied powerful symbolic-numeric tool in the area of their choice with considerable success. In this instance, they have shown how spread sheets can become far more intelligent. Runnalls et al (U.S. Pat. No. 4,786,908) on the other hand applied what are called recursive estimators to process experimental data sets of measurements which are dependent upon current state of a dynamic system in the presence of noise and other sources of errors which are representable by a statistical model. The acceptance of quadratic approximation for the log-likelihood function and residual function although may succeed to some degree in separation of noise and other errors from system's genuine dynamic responses, but so far as computational priority is concerned, better sensing means and better algorithms which can offer far better results must be pursued first; unless such an attempt fails, the necessity of getting help from estimators may not be justified.

Some of the truly important underlining issues of computations were brought up without solution by Cody, Argonne's distinguished scientist in mathematics, in 1972. Cody quoted J. Lyness's lines at IFIP '71: ". . . it is an order of magnitude easier to write two sophisticated quadrature routines than to determine which of the two is better." Cody explained in his paper the reasons for his belief that: ". . . Unfortunately, we don't always know what properties are the most important for distinguishing the difficulties of numerical solution, nor do we know how to describe these properties in parametric form. The future parametric classification and codification of problems in much the same way fingerprints are now classified is an intriguing possibility . . . . For the moment we can say that determination of the domain of a program is important, but difficult . . . . We still have a long way to go, but the day is coming when software evaluation will be a professional recognized scientific activity, and no longer an art."

Yee et al have used the power of NASA Ames CM2 computer to pursue domain analysis for determination of nonlinear system characteristics evaluation. Ames CM2 allows vast number (typically 65536) of calculations to be performed in parallel. This allows them to acquire a detailed picture of dynamic behavior of the discretizations of fluid dynamics model solved by a variety of popular finite difference methods. Their series of large scale investigation have produced large amounts of evidence to confirm that, modern computational errors without human at fault, is a truly annoying critical issue; since when they happen, they happened in the critical areas of predicting system characterization of dynamics, regardless whether it is in solid mechanics, fluid mechanics, or geotechnical engineering. It is not incidental to hear increasing news reports of engineering fiascos or design defects for state-of-the-art equipments troubled by dynamics and spurious solutions. The proofs by Yee et al were by means of comparison with theoretical solution; besides, only NASA's AMES CM2 computer could do it. Therefore, searching for means in industrial application is critically needed.

Despite the fact that the safety issue is real and serious, the prevailing measures to enhance safety are as primitive now as it was decades ago. For example, the safety sensitive space industry firms hired stress engineers skilled in hand analysis and finite element modeling. Indeed, the ability to do hand analysis can lead to the detection of computational errors orders of magnitude wrong. But hand calculation won't really pinpoint the errors of just a couple hundreds percent off from the correct solution. Another widespread misconception of guaranteed computational safety was by means of experimental tests to see whether the stress measurements are in good agreement with the predictions. Wang's paper "On Software Verification, Limitation and Classification for Computational Safety Objective" (Computers in Engineering 1988, ASME) has proven how ineffective and sometimes how misleading those test efforts are. To adopt computational results from bad numerical range, the user's common sense can be dismayed by the fact that a bit of input data change may result in thousands times of output differences in cyber garbage-land!

Another trend was to furnish designers with handbook type computational automation: for example, Roark's book "Formulas for Stress and Strain" (McGraw-Hill) was programmed by Universal Technical System, Inc. in 1986, and by Mathsoft in 1993; a series of electronic handbooks such as Hick's "Standard Handbook of Engineering Calculations" (McGraw-Hill) was programmed by Mathsoft, during the last couple years. While these do serve some purposes, they are certainly not consistent with the technological advance of time. Such computerized tools can't serve real purposes to enhance true engineering productivity and reliability. A design based on those out-of-date methods couldn't stand up to the challenge of other modern methods. Thus at best they can only serve as some kind of rough estimation. This isn't the way to nurture confidence and creativity.

Wilson (1973, 1977) by the help of "Symbolic Matrix Interpretive System" to construct CAL, Computer Analysis Language for Static and Dynamic Analysis of Structural Systems, an educational version of finite element method. Symbolic language makes use-of-full-rectangular-matrices easy, but solution with full rectangular matrices is a poor operation from both viewpoints of computational economy and elegance. Therefore, CAL was not intended for daily application usage.

Only most recently, the great interest to the symbolic interpreters has rekindled in the commercial market. Several name brands of symbolic-numeric language solvers are available such as Mathcad and Maple offered by the Mathsoft, and Mathlab offered by the Math Works. All of them emphasize the purposes of easier programming for less involved applications and graphics. They can provide handy help, but are not for the purpose to challenge the efficiency and reliability of prevailing mainstream large generalized package developed with one of the full capability high level programming languages.

Other Human-side Problems—The Analogy Between Manufacturing and Computing Economy and The Practice of Large Scale Computations With Trial-and-Errors.

So far as computation's overall objective is concerned, the overall reliability and efficiency haven't been significantly improved by the continuing improvement of certain segment of effort alone. For example, the improvement of computational algorithms may cut down CPU minutes required to complete a run, but won't help preparation of a better math model, or quicker and error-free preparation of section properties required for inputting as basic information to support the foundation of large scale computations. Any defect or inefficiency incurred, may have the same detrimental effect on the final solution pursued. Therefore, to weigh the overall needs in the long run and at the global scale is not only wise, but also is the only scientific way to avoid any insignificant event to spoil the entire effort. This type of consideration by the manufacturing people isn't new. The manufacturing cost is always a function of volume of production, finish, and tolerance required for the final product. For example, manufacturing engineer won't just use one favorite machine tool for every job. He won't do ridiculous things such as give assignment to remove thick layer of metal with precision machine tool designed for fine grinding. When the production volume is high, even the tools, the setup, and method of production can be all different, to reduce cost drastically from the single piece production. The decision is made on a long term basis and not discouraged by the initial investment needed. All these kinds of economic considerations of right tool for right job at right production volume in manufacturing are also valid for all those who access on computers for computing. Without nurturing such capacity to tap the benefit from long term basis, the abuse of machine tool equivalence in computational reality is far more serious than imagined. For example, to solve a large size thin plate structure buckling problem with expensive non-linear theory option of finite element method, one did trial and error as usual to propose a design without an idea about what one would get from the effort. This quickly depleted one's rich funding, by paying bills for effort of modeling and for very expensive computer charge incurred from trial-and-errors runs, to no longer affordable. Because it simply consumed a great deal of CPU hours on mainframe computer with a powerful program; and after each round of very substantial modeling effort spent, the results gave users no clue on the trouble of the solution's divergence. This was attributed to user's inexperience, comparable to feeding into an automatic machine tool undersized blanks which each time resulted in a finished piece failing to pass inspection. This was too obvious for a machinist, but hasn't been too popular to most users who access engineering computations since there is no scrutiny of user's qualification and no result inspection. Ironically, as sad as it is, the out right waste to gain nothing is still luckier than other forms of traps when a set of syntactically acceptable input leads to spurious solution without warning.

To eliminate such mess in modern computing circle, some conventional wisdom to blame higher education seems to over simplify the issue. Next to the creation of correct incentive that is to attract right users on right job and have no hesitation to make right decision; the second best, should be common sense education. An education should not only help analysts treat their computing like manufacturing engineers treat their machining, but also help ordinary citizen see the harm of fiasco in modern engineering!

SUMMARY OF THE INVENTION

To bring the computational power to all who need them and make it inline with our time of technological advance is the primary objective of this invention. The reasons for why analytical tools must be provided have been proven by the evidence given in last section. Now, the missions and the steps to change the intolerable situations with the current arts will be explained.

This inspires a thought. With the help of computer aided techniques today, the same solution method implemented in a system environment is most suitable for computational automation, the added user friendliness allows user's easy access, and the added computational power allows computers to deliver economically its own proofs for good or bad numerical syndrome for easy judgement. After then, engineers and designers with computer's power at hand will have far more, rather than far less confidence in their computations than their predecessors who lived in the age of slide rules. With these thoughts in mind, the specific mission requirements for the development of this kind of software now can be defined:

Requirement 1. The powerful tool goes to a user remains powerful only if the user can use it correctly. Therefore the emphasis is made to help the user's end while making the programming development effort effective and affordable.

Requirement 2. The chain fails at its weakest link in a mechanical system. The same is true for the computational troubles. Useless results can be caused by deficiencies at any phase of effort contributed by tools or people of any role to the name of the game. Therefore, improvement of solution method alone has limited value. Overall improvement is needed.

Requirement 3. The automation should help rather replace user's ability to judge, to think, and to question. However, it does no harm to replace tedious procedural matters as long as users know to some degree what it is for. Creativity, elegance, and final judgement of safety and economy are missions far more suitable for humans than for computers from both viewpoints of human's special talents and why human needs computer in the first place.

Requirement 4. The flexible computational automation system, built up with reliable objective tasks to be used individually and combinatively, can be the most economically to create, the easiest for users to understand, and the most versatile and powerful to apply.

Requirement 5. The inferior solvers should be replaced with elegant ones in the evolution. But before it will become popular, it is vital to create a tool that can make fair and economic comparison between two solvers to determine which one is better.

Requirement 6. More important than knowing software quality is to know whether an operation is performed in good or bad numerical domain of variables. Without this confidence, even better solvers won't always assure safety. Means to reach such confidence is vital to make computerized computation truly powerful.

Requirement 7. For all above reasons, there are a number of programming strategies that can be set: a. To separate codes modules in terms of objective tasks. Some of them become library items. In this way the programming effort in the long run is not to program entire system, even not to re-program elegant and efficient solvers, but mainly to program how to add new objective tasks and to decode for their mission assignments. b. To enforce cyberspace standardization. This is to allow: i. The programs that receive other's output file information as its input or vice versa can always match well by default. ii. The objective tasks that serve same purpose assume same global name in the computational automation system environment throughout all programs will save programming effort as well as user's memory on how to use them. iii. The similarity in all rules regarding running a program or its options. This eases the memory of learning how to run a program, and knowing what the common options programs normally have. So that once it is learned, it will be very difficult to forget. This removes the common trouble caused by the difficulty of memorizing either the nature of wholesale operational procedures for large software packages or the nature of diversities for running special purpose programs all one of a kind. c. To emphasize the generalize logic in coding development including accepting structural similarity in addition to item "a" will maximize the reusable portion of codes with least vulnerability to coding errors.

Following the above mentioned basic mission requirements outlined, the programming of computational automation software shall follow the following key steps to generate the basic components to meet the requirements' expectation:

Step 1. Adopt symbolic-numeric input option to allow computer to accept human jargons, as a supplemental channel of human-machine communication. This enables computer to read in tasks names, variable names, and numerical constants associate to the variables and/or tasks. This additional input channel serves three major purposes: 1) To reach out the variables or tasks at the run time without preprogrammed input or output requirements. This is important for not only saving time, saving unwanted burden, but also gives users a much greater freedom to enhance the reliability and affordability for advanced maneuvers—such as domain analysis, parametric study, and optimization—a maneuver of order of magnitude more difficult than a straight single run. 2) Allow reassigning variable values directly without re-entering the complete set of data. To change entire set of input for the purpose of changing a few of them wastes effort and invites human errors. 3) Allow communication that otherwise is a job that can be materialized only by coding statements revision, re-compiling and re-linking. This opens up entire possibility for flexible computational automation, also gives large scale automatic computation such as parametric study a true life. Without such capability, not to mention about the generating error-free input queue file for unlimited number of individual runs, including the output summary specification for providing curves and graphics as unrealistic luxury; the massive output of unwanted information alone is sufficient to create a mountain of garbage to make the task unaffordable.

Step 2. Adopt sequential input option for regular interactive run and input queue run for parametric study. The parametric study is for investigation about the variation of output results as a function of certain input parameters vary. Domain analysis is a kind of parametric study, that serves to detect whether the computations performed are within the valid numerical ranges of input parameters without creating numerical ill conditions to turn good input into outrageous output.

To enable the interactive run and input queue runs to share the same program, a flag must be provided at the end of input for interactive run. A flag value 0 indicates the termination of sequential input, a flag value 1 indicates the case of automated input queue runs, in such case input read will continue to read in additional information for the control of output requirement for the automatic disposal of results achieved from each and every consecutive batch queue runs for summarizing in graphic report or further analyzing for any other purposes only limited by user's creativity and imagination. The symbolic-numeric contents of the information give the directives about actions the computer to be followed for the disposal of results from automated runs.

Step 3. To create decoding routines to translate users' symbolic-numeric input data. This step is to turn the enormous burden of learning and memorizing computer jargons by every user over to computers. Computers can read and memorize human's jargons through programming effort that can be settled once. In addition to this, the automation of procedural matters that could be too tedious to do by the customary practice could then be justified through the viewpoint of strengthening system operational reliability. The decoders allow computers to respond to various objective tasks individually, or combinatively in flexible automation style. This allows the most versatile usage of building blocks of objective tasks to achieve the goal of automated computations. This eases the learning for how to operate, and gives users a deeper involvement in decision making. Namely, let users be in charge, and let the computer do the job. The user knows what computer is doing yet without the risk of "to err is human" is important for the objective of computations.

Step 4. To create the rules to save users' and programmers' effort, while making operations safe and automation flexible.

Rule 1. Adopt cyber space standardization to cut down programming, learning and skill retention effort. Standardized items include: a. To open up necessary number of files to write to and to read from so that computer can do every thing to treasure user's effort, such as to maintain current input data update, to keep current session logs, to store automatic input queue database generated by computer per user's simple instructions. b. Formats of writing data on files and reading data from files. This is imposed on all results that need further processing, but is waived on the others. c. The main program and the main menu. d. Post-processor for graphics. e. Graphic programs. f. Global task names and operations.

Rule 2. Adopt the same rules for various options of input and of objective task operations.

Step 5. Guidelines of using existing software or solution packages. By virtue of increased user-machine communication ability, there is no need to rewrite all solvers in order to take advantage of such system. Small size solver can be adapted virtually without change except adding common statements to allow all updated input to reach solvers; and a call to an output subroutine to make it conform with standardization of the system. As to the large general purpose programs, they can be adapted to the system in form of limited capability like a piece-wise retail of large wholesale items. In such a case, the translators must include self-contained pre-processor with automatic math modeling capability for specific product line items permissible to be described by the same algorithms, plus definitions of key symbolic variables and output functions under the range of investigation. In addition, a postprocessor is needed to bring intended output results to conform with system standardization requirement.

Step 6. To provide capability to cope with the need: "users must verify their own results".

Rule 1. Adopt computational automation to domain analysis or parametric study.

Rule 2. Provide alternative solution. Preferably they are of significantly different in basic formulation to avoid the same numerical troubles occurring at the same time.

Rule 3. Make critical areas of computations available to users for inspection. This rule applies if Rule 2 fails to find suitable candidate.

BRIEF DESCRIPTION OF THE DRAWINGS

The drawings of this invention convey the same ideas as the skeleton of the present invention and bring the key points of objects, features, and attendant advantages more effectively and quickly accessible to the reader than the lengthy descriptions can. Thus, the present invention can be more fully appreciated and become better understood when references are made to these accompanying drawings, in which

FIG. 1a shows all invalid results departure from genuine results by orders of magnitude without programming bugs or human errors. It is both the truth and the myth. The popular formulas frequently are among the things people rely on, yet ironically more than often they happen to be less reliable instead.

FIG. 1b shows far better solution is within reach. Sometimes it needs great ingenuity, but for this case it only needs a desire and willingness to accept the message that better alternatives of developing a computational solver do exist, and it is worth consideration. Yet the latter consensus remains unpopular.

FIG. 1c represents the same computation as FIG. 1a except now each dot in the picture represent a root XR1, (R stands for real part, 1 represents smaller root in absolute value) in each computational case.

FIG. 1d shows a segment of computation in FIG. 1b, and tells two things. First, the result of the root in question is awfully close to the value of −1.100 but not a constant. Second, the results preserve good numerical precision.

FIG. 1e shows that to compare the quality of two programs now can be accurately, and economically done by adopting the method of present invention.

FIG. 2a shows both the excellent solver and not too good solver. Not very good solver tends to lose accuracy as curve beam radius increases.

FIG. 2b shows longer range of parametric analysis comparisons between two methods.

FIG. 2c shows curved beam's key attraction of spurious solutions. Each pair of dots represents one computational case.

FIG. 2d shows the overall comparison of very long range of applications. The results from solutions of textbook method totally lost physical meaning in vest range that can be visible in the picture. (see FIG. 2a for the key of curves)

FIG. 2e shows how bad is bad when curved beam textbook method runs into numerical garbage-land: Over 8965 folds departure from correct answer have been recorded without very strict search. When those serious sensitivities appear, a bit of difference in input shift may mean a big difference.

FIG. 3a Executive driver.

FIG. 3b Batch queue driver.

FIG. 3c Input queue database—Sample of internally convertible data sets.

FIG. 4 The most desirable capability within system for engineering computing—the mandatory items and optional items.

FIG. 4c The available task forms.

FIG. 4d The available output options.

FIG. 4e The available solution options.

FIG. 4f The available task function levels.

FIG. 5 The main menu that reflects the new innovations.

FIG. 6a Example 1 for TASK 6, alternative means of solutions.

FIG. 6b Example 2 for TASK 6, alternative means of solutions.

FIG. 7 Shows computer guided SYMBOLIC-NUMERIC INPUT OPTION.

FIG. 8a A Demo Program Showing Current Rewarding Rule Punishes Elegance and Encourages Inefficiency—The program code.

FIG. 8b Two cases of input for the computer code (FIG. 8a).

FIG. 8c The comparison of results obtained from NASTRAN finite element method versus Navier's Method (FIG. 8a).

ASSEMBLY OF THE COMPONENTS—EMBODIMENT OF INVENTION

Figure 1A:
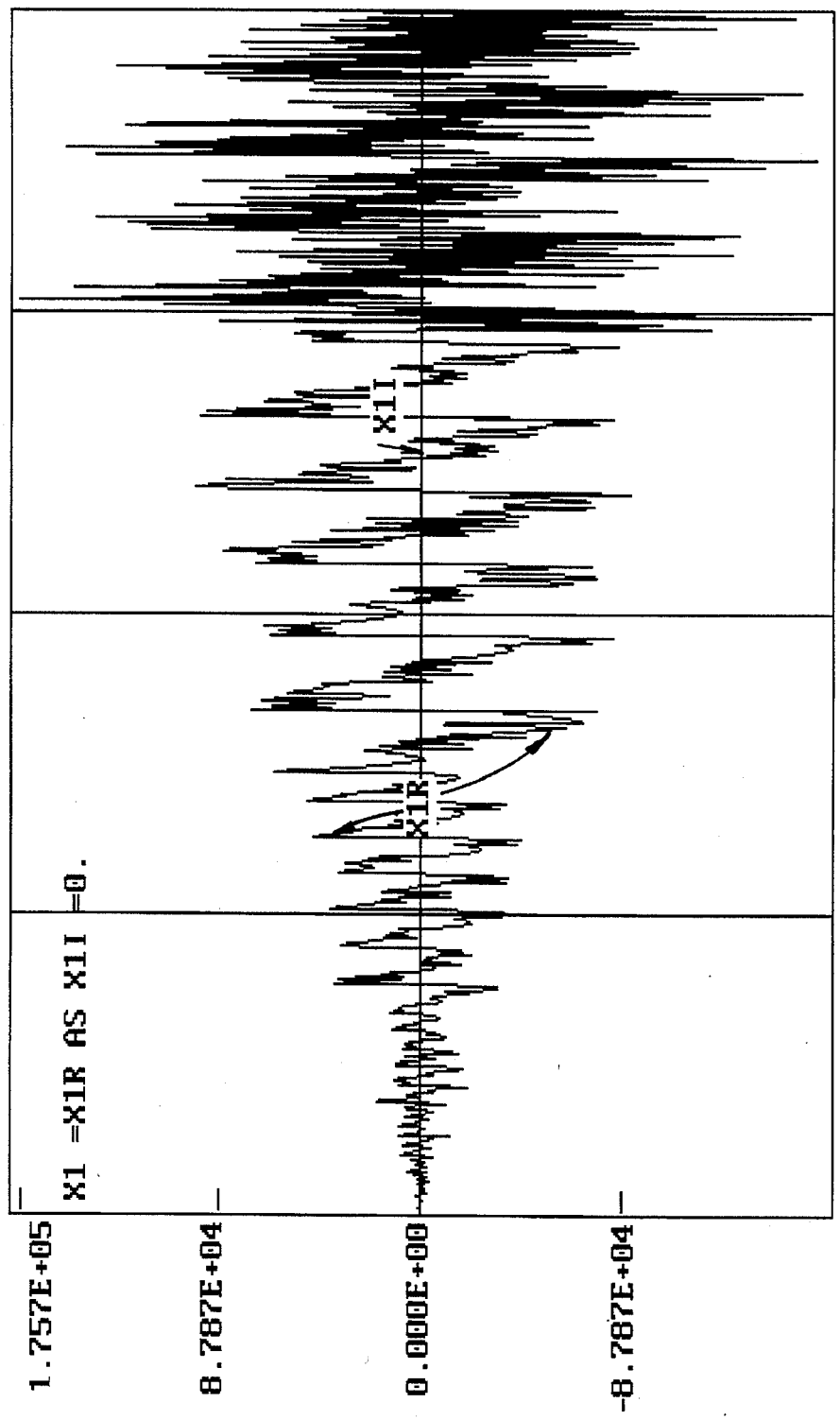
FIGS. 1a through 1e show that to accept computer results even as simple as finding useful roots of simple quadratic equation on computers is dangerous. There are still credibility gaps unanswered by status quo: "Users must verify their own results", yet there is no rule and no tool to enforce such requirement stated as common disclaimer by most software developers.
Figure 1B:
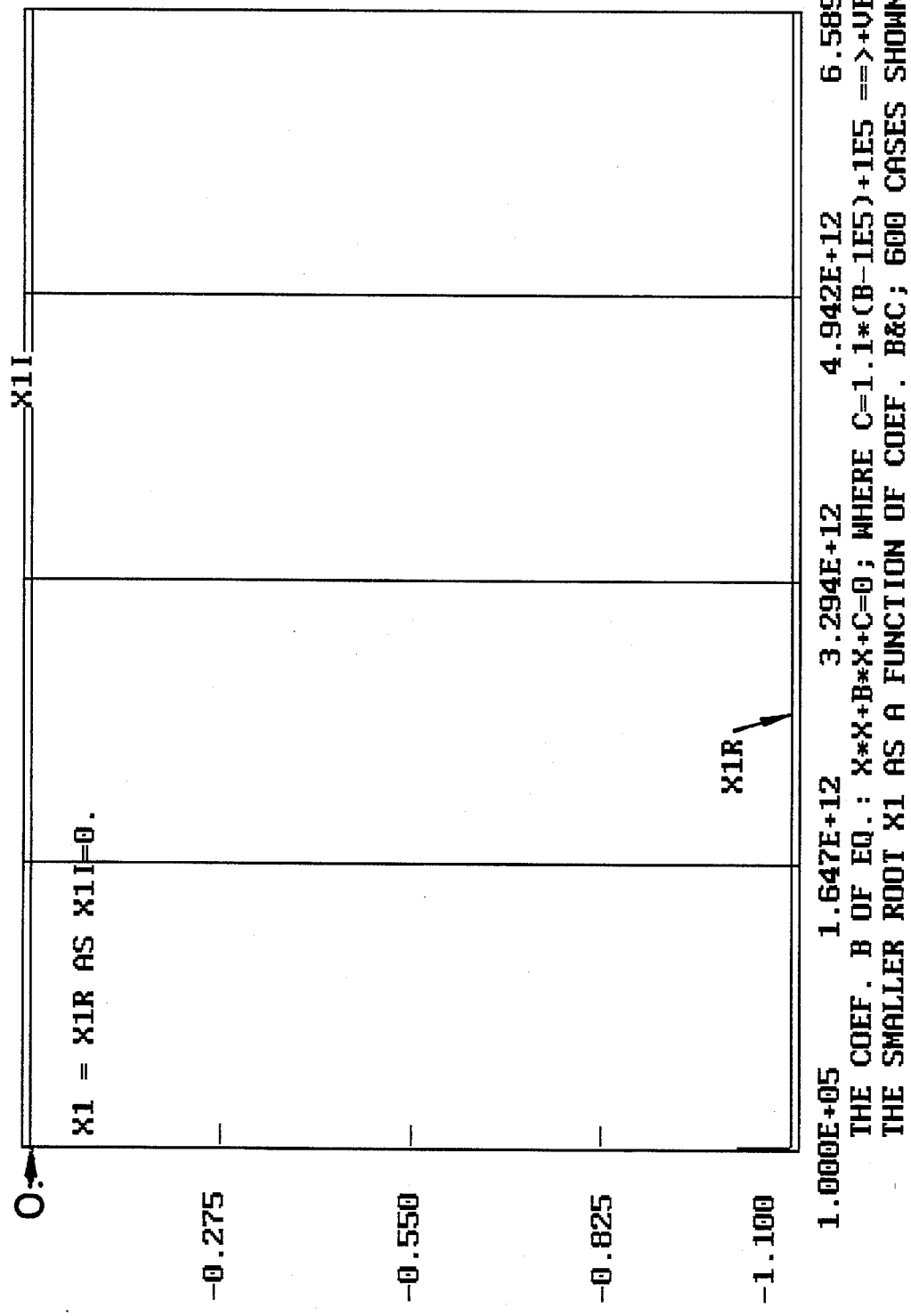
Figure 1C:
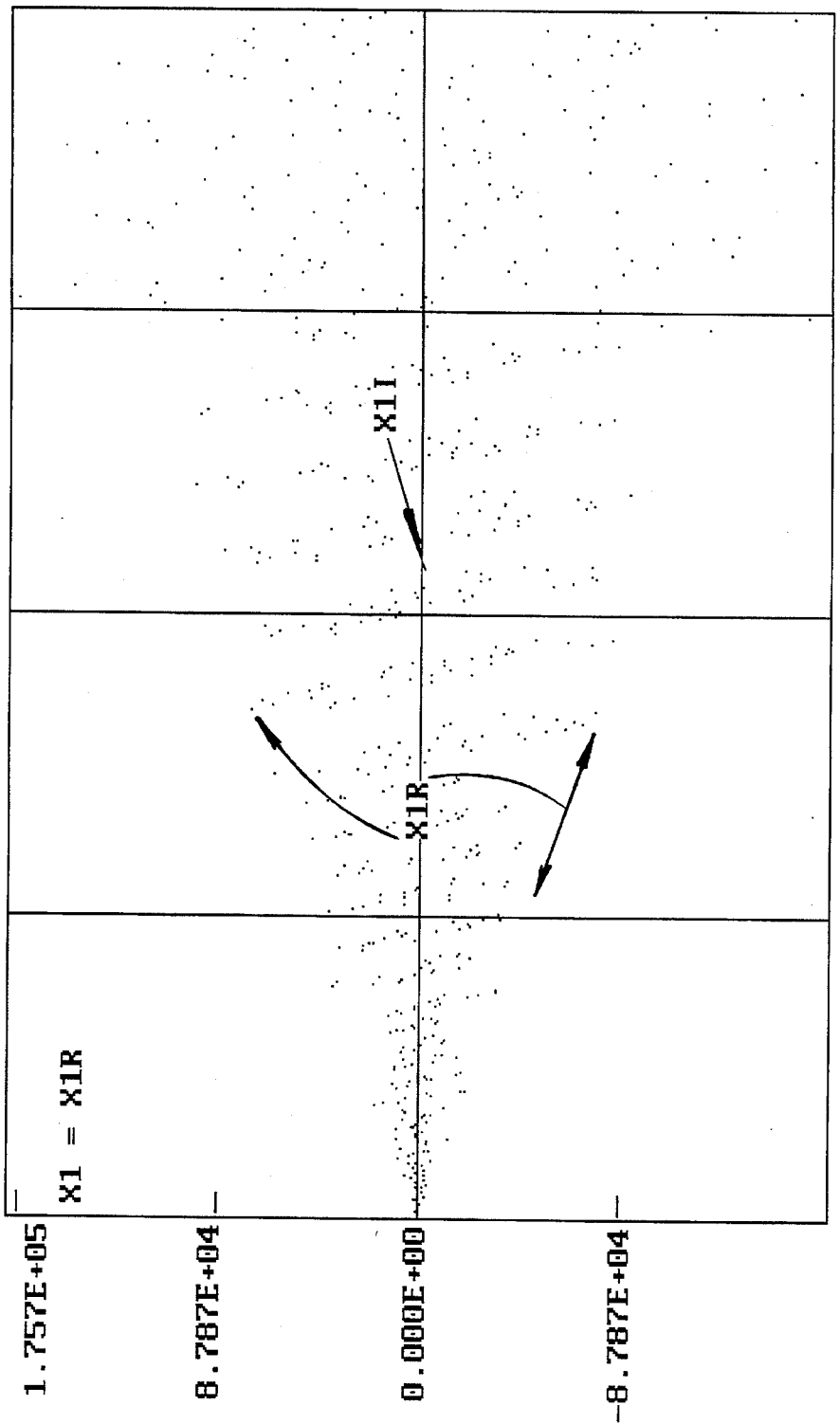
Figure 1D:
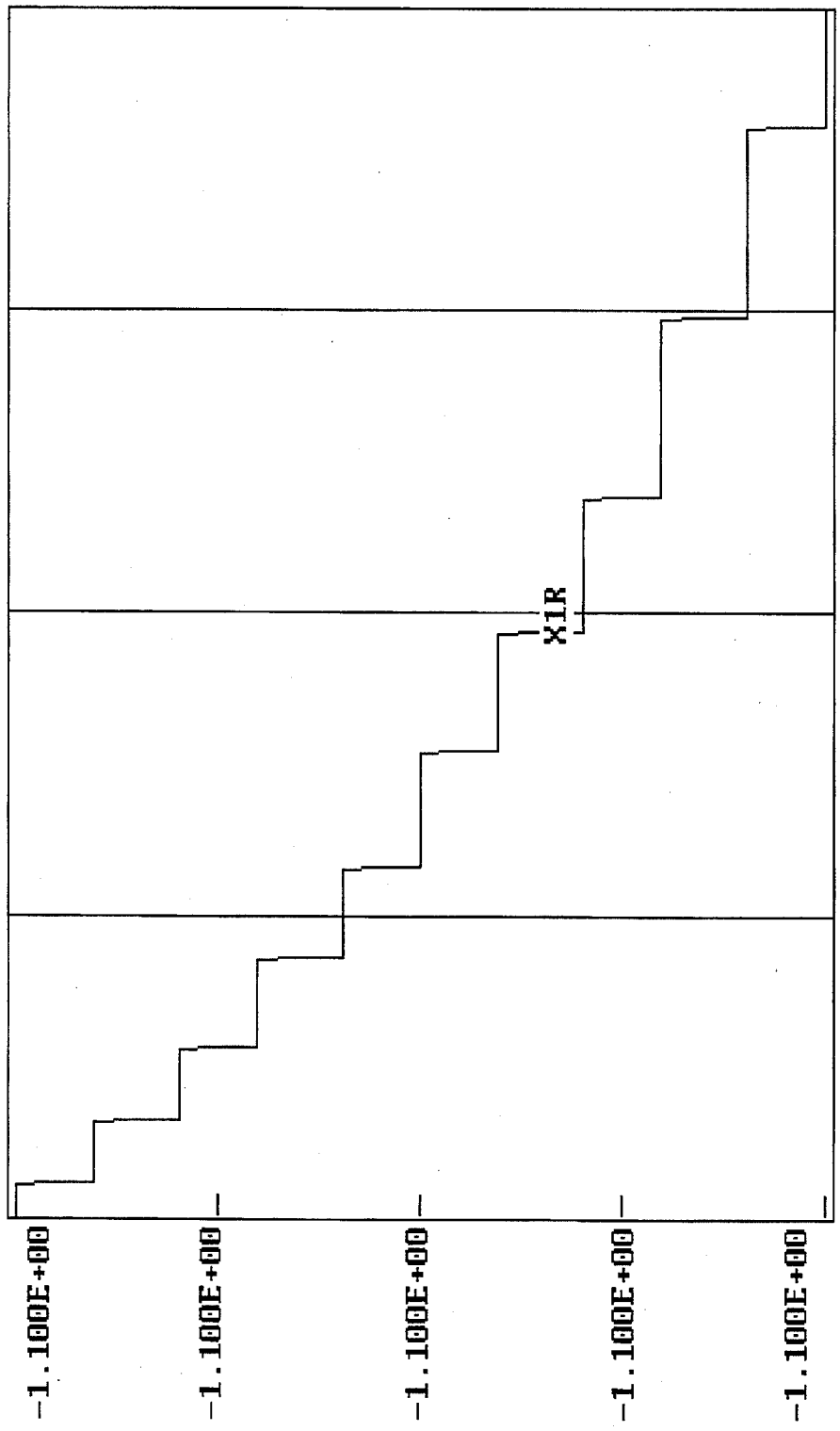
Figure 1E:
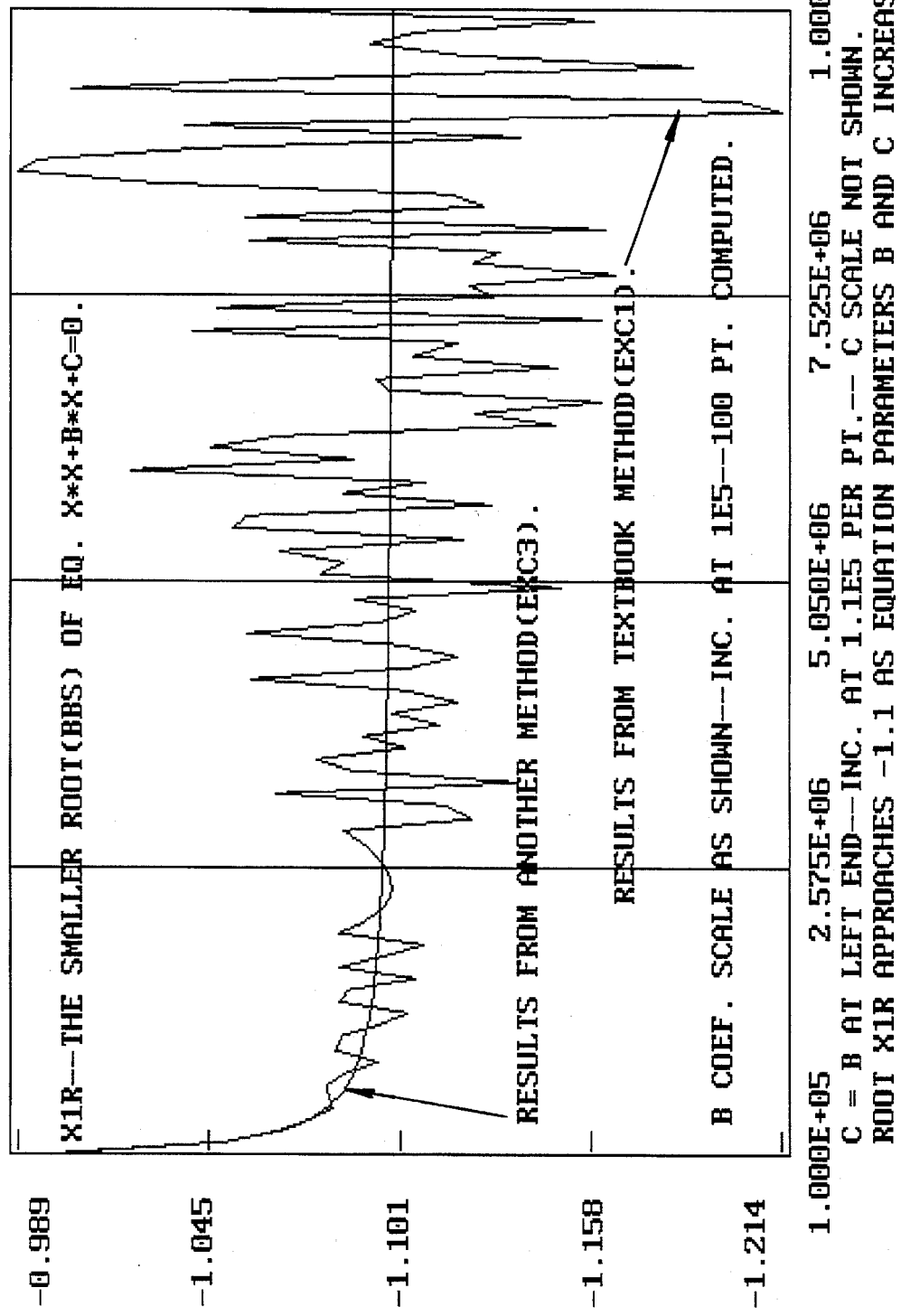
Figure 2A:
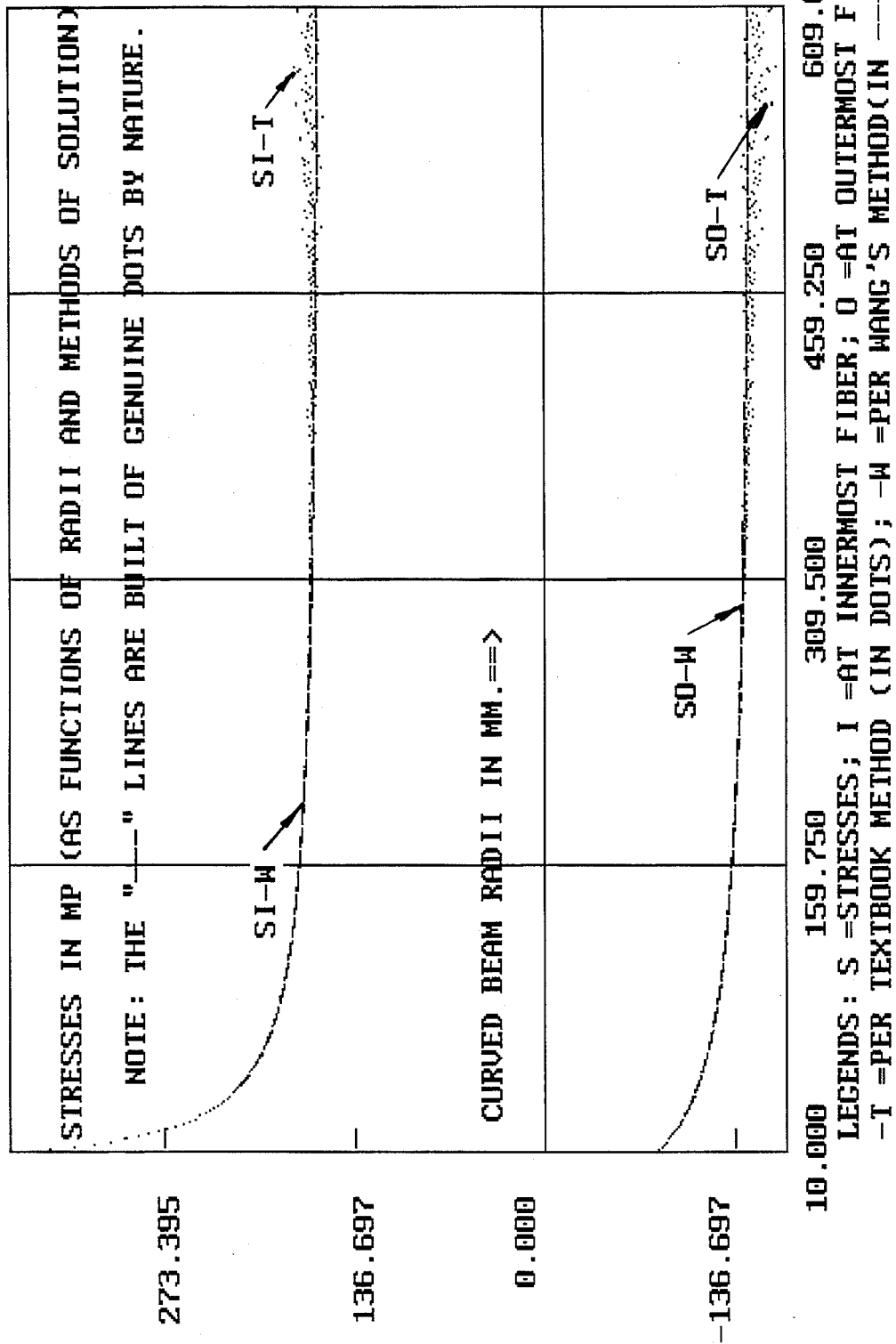
FIGS. 2a through 2e show the curved beam lessons on computational hazard and how they can be overcome.
Figure 2B:
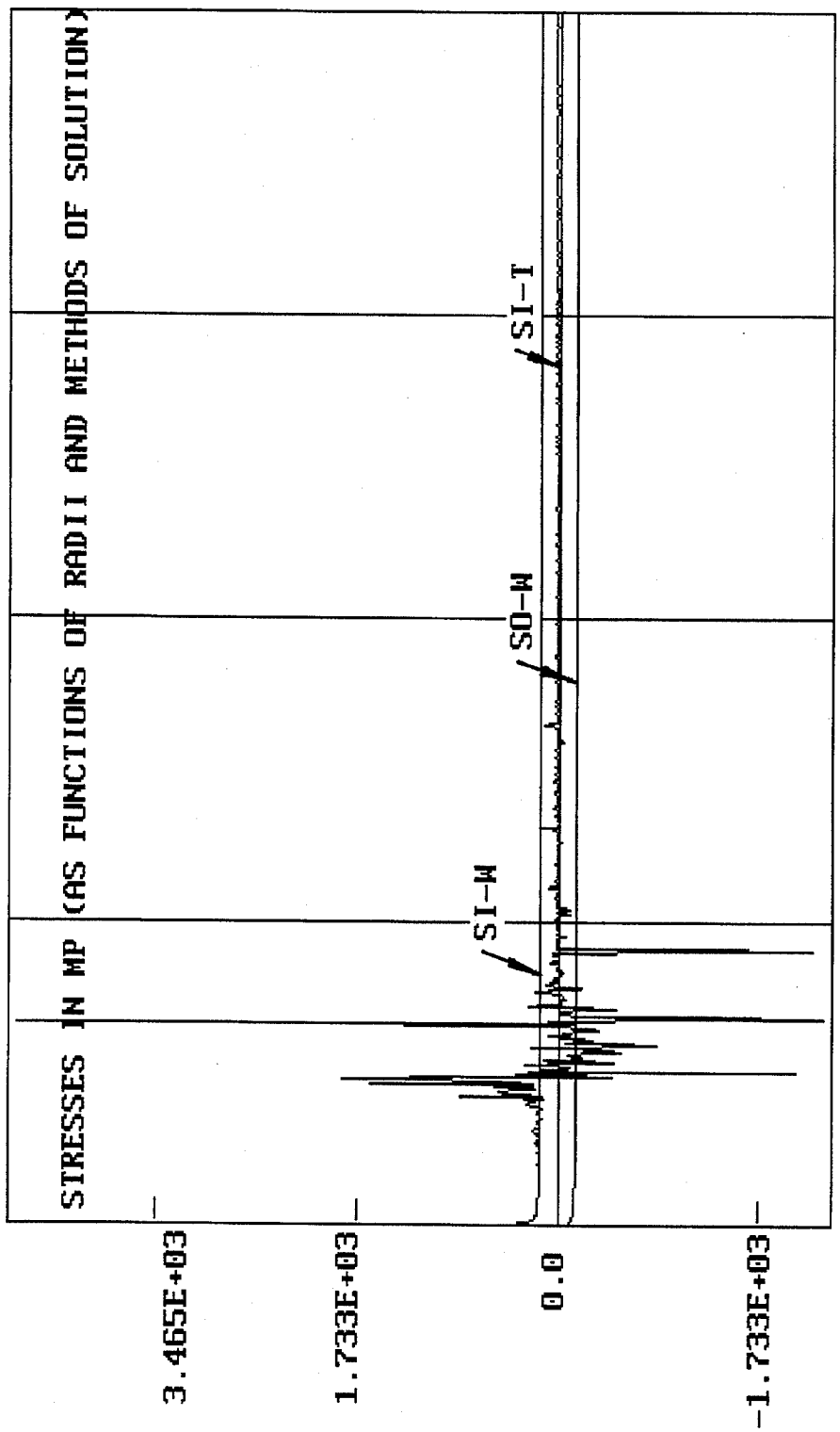
Figure 2C:
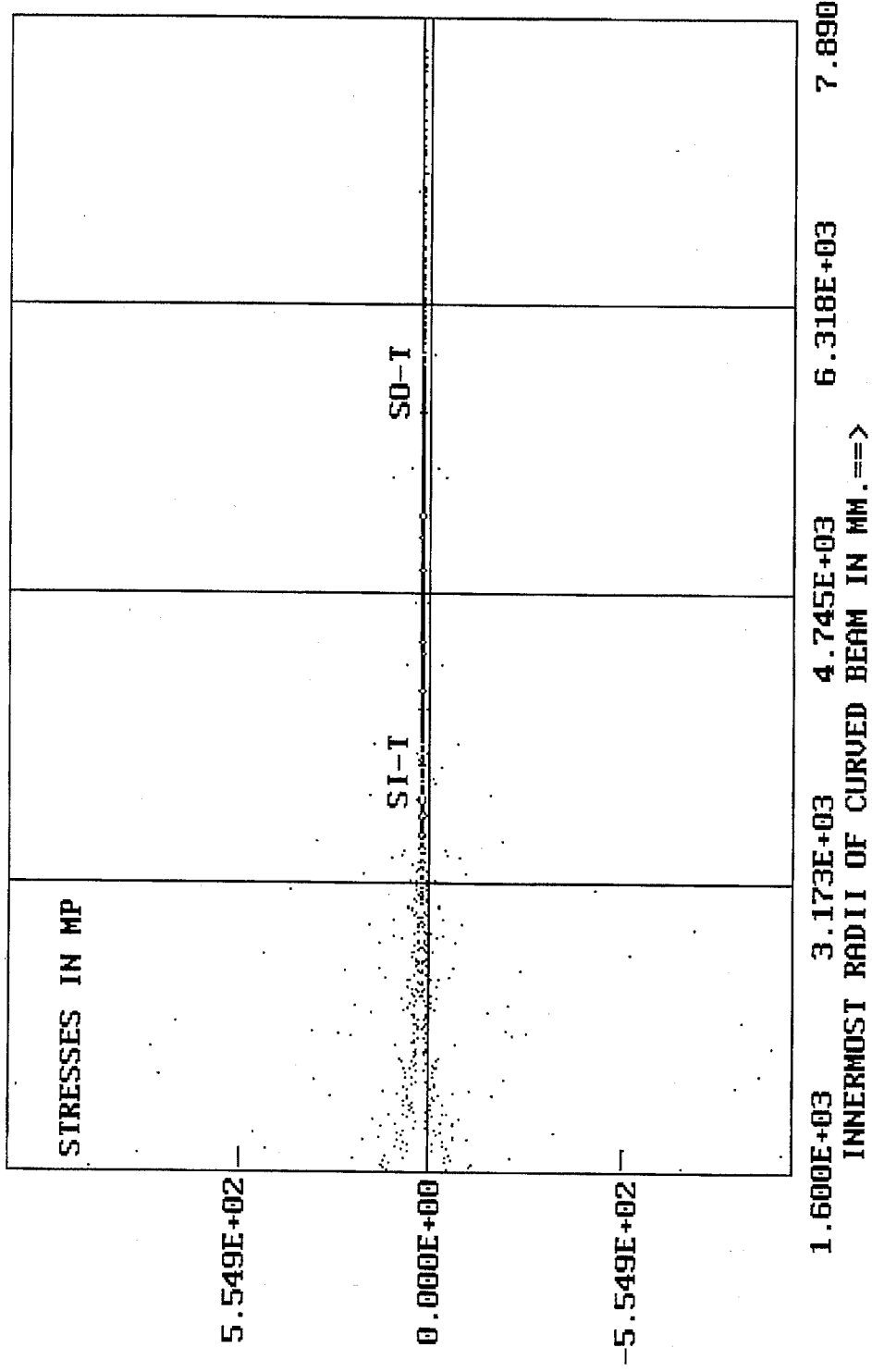
Figure 2D:
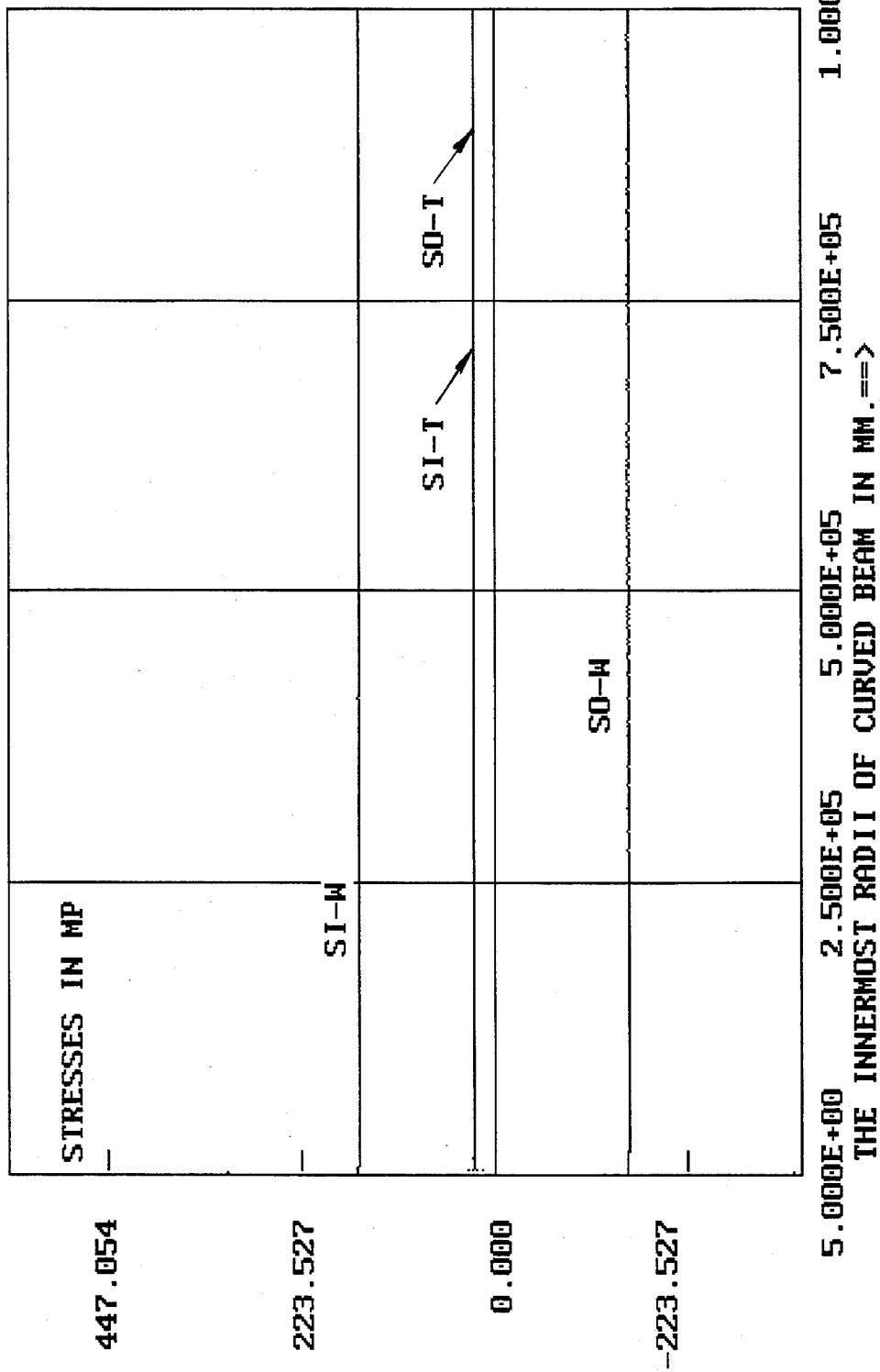
Figure 2E:
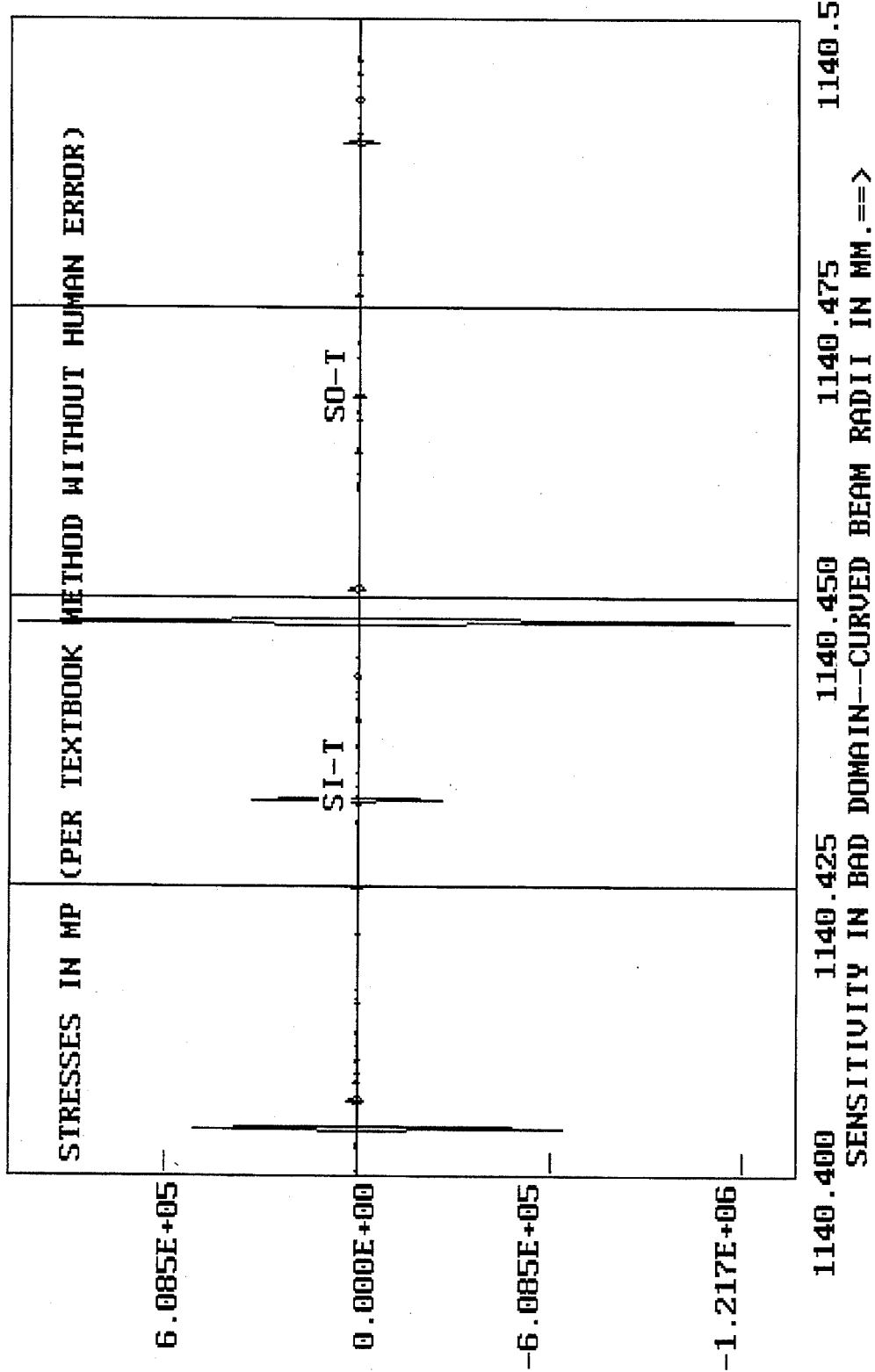

A software system that follows the above mentioned missions and programming requirement steps is now ready to be assembled into a new tool for purposes extending beyond the current conventional programs for engineering analyses. The conventional programs in general treat engineering judgement as users' own business and as something that can be gained through the lapse of time without special effort built in tools to nurture such desperately needed quality. The present invention makes concrete step to fill this void.

The Evidence of Spurious Solutions Exist and Can't Be Ignored.

First of all, the invention shows in terms of two examples (illustrated in FIGS. 1a through 1e and 2a through 2e) that disregarding program quality and its influence to the validity of parameters' numerical ranges in application are not as safe or as deserving the risk as many people thought. To understand how and why the same computer and the same mathematically equivalent formulations, either just by switching something around, or requiring pain-staking soul searching, could result in a world of difference in computational outcomes, must really tell something. By coincidence or by the arrangement of the nature, the textbook methods (the most popular methods) frequently are found among the least desirable way to make our computers look good. The solution that costs far more between two competing methods, is also frequently the least trustworthy. All these empirical rules of thumb in real life deserve at least to attract people's curiosity for a closer look. If not all programs are the same, then how great the contrast that can possibly happen? Does one need to check each and every case to assure safety, or does one just need to know roughly about one's own tool: from what numerical ranges and on, the computer's predictions can't be trusted?

These questions are answered with evidence provided by the parametric study sample runs as indicated. Meanings of these two example are now explained: Example 1. Solving quadratic equation with computers (shown in FIGS. 1a through 1e). The high school algebra has provide solution formula for this problem. The test is made to use equation coefficient B and C as parameters to vary and to observe their effect to the change of smaller root of the equation started with B=1e5 and C=1e5, increment is made following a rule that the increment for C coefficient is equal to 1.1 times the value of corresponding increment of B coefficient. This results in an asymptotic solution −1.1 for the smaller (abs.) real root of the equation to be solved. The finding was that when equation coefficients B and C are large enough, the textbook method delivers outrageous spurious solutions even for relatively trivial reasons. From compiler's nonstandard feature to solving smaller root with its reciprocal substitution, all make amazing differences. Example 2. Solving curved beam stresses. (Using example from the textbook by Boresi et al: Advanced Mechanics of Materials, 3rd ed. 1978, 4th ed. 1990). Computational tests were made to investigate the effect of change for r, the radius of curvature, to the predicted stresses at both innermost and outermost fibers of curved beam (for a sample section under specific given loads). The textbook's method has been compared with a more thoughtful method numerically and graphically, drawn in exactly same scale to see when results of different methods coincide exactly, and when the two results started to contradict against each other. This again is an asymptotic problem. When r is large, the curved beam should behave virtually like a straight beam. But instead, the textbook method won't predict that, even when r is still relatively small. The above findings tell that not all programs are the same. Even closed-form solutions can go wrong. Highly popular methods, apparently did not take what computers can do or can not do into consideration, and generally fared very poor. When results went wrong, the severity depends on numeric ranges, not on random chances. Parametric analysis has shown great potential that domain map for good and bad numerical ranges can be drawn, even though computations can be enormous. However, the bad method should be eliminated first; then life will automatically become far easier. Now, it is to answer when computers go wrong, how wrong is wrong? The sample evidence indicated that computer's spurious solution without programming bug and human error could be as high as in the order of thousands to over 160,000 folds departure from decent solutions (compare FIG. 1a with FIG. 1b, and FIG. 2e with FIG. 2b.). As a strategy to deal with errors, there is no need to verify every cases if domain information can be concluded. Witnessing computing error mechanisms once, we will be far safer and more confident managing the issue of spurious solutions. Simply forget about to do experimental test to defend good computer results inside bad numerical ranges; even though people certainly have no difficult to find quite a few cases from FIG. 1c or FIG. 2c to justify that programs are still doing OK in some instances. Instead, by paying attention to the fact that there is such a point which can be scientifically found, beyond that point better solvers and worse solvers no longer get the same results (see FIGS. 1e, 2a, and 2b), if one can use them as a warning sign like the yellow traffic light, one will be always safe! Good solvers are like freeways, one drives on it and never sees a red light (see line XR1 in FIG. 1b and lines SI-W, and SO-W of FIG. 2d). One may also like to notice that even on the freeway, the road conditions can be either smooth or somewhat bumpy (compare FIG. 2d's SI-W with SO-W, the latter has an error bound of about 1 percent).

Programing Structure—The Flow Diagram.

FIGS. 3, and 4a through 4f provides the blue print for present invention that allows engineers' computational tools and engineers' desirable professional skill training enhance each other.

Figure 3:
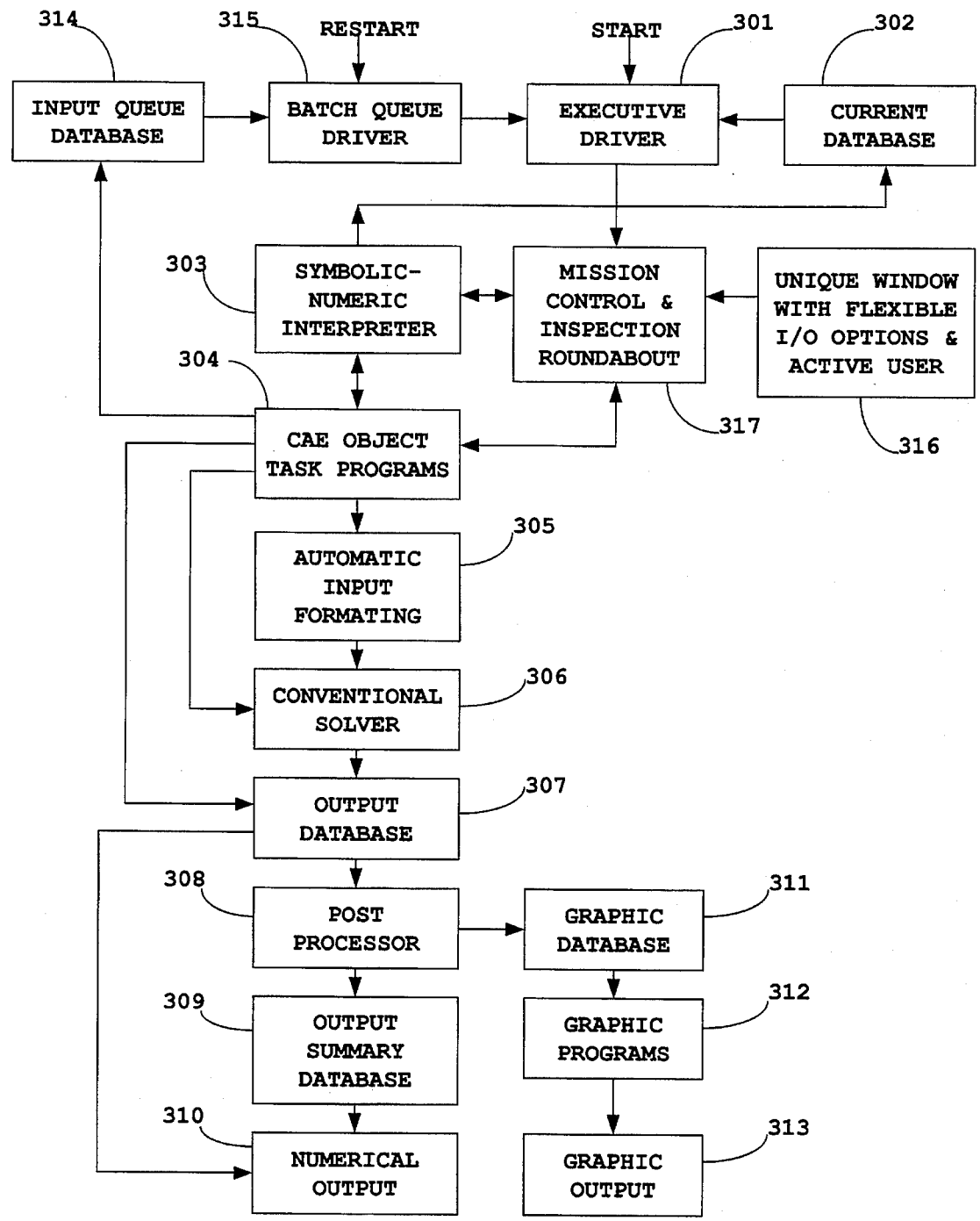
FIG. 3 The global objective programming structure of this invention—The flow chart of automated computing system.

The flow diagram of the programming structure for such a system is shown in FIG. 3. The meanings of the component blocks are now explained as follows (the meanings of components have been extended to the role of users (316), and dynamics of communication (317), their effects are significant and can not be ignored):

301, the executive driver which is a main program shared by all applications. This main program serves to assign a number of files, to satisfy the minimum requirement to live with the necessary missions, and to make the last session and this session a continuation. Whatever the information on file in the end of last session, will stay at the beginning of the current session. So, one can log off and go to lunch and return to continue from the end of morning session in the afternoon. This is the exemplar spirit of the simplest one. The most involved one the input queue file, or alternatively it can be used as scratch file, can turn computations into automation or dynamic iteration depending on how intelligent objective tasks will be designed and read in at run time. The significant thing which is most important to recognize for now is that the direct communication with computer will be available at the end of each and every task execution with current variables and result functions values all under whatever new task program's disposal to inform computer what to do for next step. This power reserve in computational automation is enormous, so is the user's active role in tapping such power to solve highly advanced problems. Therefore, the meaning of a nearly empty main program which contains files of these types each serves a significant purpose in such system. FIG. 3a shows: 331, a session log file; 332 and 336, one or more input information file (non-symbolic input) file; 333, current symbolic (key) variable input file which allows the storage of all key variables within the reach of symbols plus the extra symbolic-numeric information for output control; 334, an input queue database file which stores multiple input cases (any integer number greater than 1) from computer generated input information designed for automated computer runs; and 335, a graphic data file for graphical information whose inclusion is flexible and depends on program user's free decision made at the program run-time. The reason for making automated machine input executions different from manual execution or other batch runs is because the graphic output requirement is determined during the interactive session at run time. In execution of automated input queue such interactive session is suspended. To fill this void and preserve output flexibility, the user's intention was answered at the stage of input queue data preparation, following the input of PARAMETRIC statement (see example P. A8). Such extra information will be written in input queue data file after the sequential input continuation switch code No. "1" (352, FIG. 3c). An example of such additional input requirement for the desired output definition is shown in input queue FIG. 3c, lines 353 and 354. Besides, such flexibility in output is needed to avoid the needless huge output for large size parametric study problems. The current database 302 stores the current input information that contains all parameters except the redundant ones (354, because in 353 the number codes 11 and 13 imply the same contents of 354) subject to the symbolic-numeric maneuver (351–353). Other inputs which are not subject to symbolic-numeric maneuver will be stored in separate file(s). The symbolic-numeric interpreter 303 is used to interpret symbolic-numeric input. When this capability is supported with decoders, it enhances the power and efficiency of both human and machine in immense magnitude. Present invention adopts symbolic-numeric capability in strategic important places for economic reason. It does not use one option to replace, but rather to enhance, the other. The main purpose is to open up an avenue to address not just the flexibility of computational automation, but also how to gain the confidence from the computations, and how to nurture engineer's needs. Every thing is designed to serve the best interest of humans. The key to materialize such dream is to replace rigid, push button automation into engineers-inside-the-loop automation. Computers are only used to help, not to replace or to defeat engineer's vision. 304, CAE objective task programs, FIG. 4 shows what these program collections are supposed to do. The optional feature should have no limitation, or a limitation only limited by human's creativity and imagination to come up other objective tasks within what such system can do. For example, symbolic-numeric input update and human-machine communication feature conceive the power are by no means limited to the random update, or dynamic update capability (the latter means to update variable value at run time); the mandatory feature of decoders to process "QUEUE" statement (see example on page A7) implies that the calculated update or logical update before the execution of the next run for any of solver within the system is just a matter of exercising the power in the hands. Converting drawing requirement into input requirement, 402 is an option which applies to certain problems only. Parametric study, 403, also called domain analysis, a very headache and expensive undertaking in the past has turned into a very effective, economical, mandatory routine in the present invention. The optimization, 404, and equal strength calculation, 405, are both luxury items in computation in the past. Now they can be done in several ways, depending on the nature of generality required. For very specific problems the creative usage of human-machine communication power with dynamic variable update will do. The iterative usage of parametric study sometimes may also lead to unexpectedly good solution to challenge the credibility of other major computations in a very economic way. Data switch from one group to another, 406, could be the easiest thing to do to avoid human error and improve the quality of results and results comparison. Outside the automated system it may most likely do by hands and created a needless weak spot because of too simple to worth an automatic data conversion from one set to another. For example, the conjugate relationship for gear pair, or math input for the same problem but expressed in totally different forms, such as quadratic equation can be solved in a form of math model. Alternative solutions, 407, is a mandatory option to ease the burden that asks "Users must verify their own results"; if there is no alternative solution in unusual circumstances, other measures such as, safety assurance options, 408, and/or examination window for solution quality, 409, should be provided as alternative protection. The safety assurance options, 408, applies to deal with known dangers for numerical sensitive problems when all measures are known to have leaks. The internal safety inspection may be designed to stop the uncertainties from being printed out. The examination window, 409, is the option to allow critical area of computation accessible to users for inspection—a more rational way than simply asking "Users must verify their own results". Other objective tasks, 410, include decoders to make computer recognize human jargons and things regarding the disposal of information available for specific CAE objective task, turning messages received into enforceable actions. Computer aided data check, 411 is another way to make computer more user friendly and relieve engineers' need to work on the things that are far tedious and not human's strong areas. When engineers face increasingly complex problems, detecting input errors or software deficiencies becomes increasing difficult. A highly intelligent, and economical means of error detecting deserves to be considered as a desirable options. The new reality users face not only the lack of ability to judge a bad output, but also lack of certainty about when one can stop their input data checking. 305, the automatic input formatting and 306, conventional solver are the optional components for the system. All outputs eventually end up in output database, 307. There are two possible disposal to the results. The results will either pass on to post-processor 308, or direct go to output devices 310. The data pass on to post-processor 308 will be further redirected to two destinations: one is to be stored into the output summary database 309 ready for output device 310 to print out; another is to be further processed into graphic file of right format and saved in graphic database 311. The graphic programs, 312, will process graphical files with automated scaling and turning information to graphics display or printer 313. In dealing with parametric study, the decoders will interpret meanings of users statement correctly and call an I/O utility subroutine to respond whether it needs more information from users. Once information is complete, the input queue file will be written and stored in database 314. An example for such file is illustrated in FIG. 3c. Example of interactive session allowing output requirement flexibility is shown in pages A7 to A9. Other symbolic-numeric task treatments can be done in like manner, with or without interactive session depending on whether the run time flexibility for I/O decision is needed or not. For example, the "queue" statement shown in page A7 doesn't need further information from users.

To execute parametric study input queue, a restart for batch run is needed. A batch job control program, 315, is also called batch queue driver. An example of such component is shown in FIG. 3b. In FIG. 3b, IM1.SCR is the data queue as written. To copy IM1.SCR for execution is for both security reason and provide room for possibly using IM1.SCR as dynamic execution scratch file. 340 shows that a copy of IM1.SCR onto new name SSS1.LOG has been made. 341 shows that the same driver is used for all different programs so that dummy name %1 is used; 342 is to remind that the condition of program resource sharing is on the basis of standardization in format. 343 represents programs for graphics. These programs are written for general purpose on a once forever basis but do not exclude the need for maintenance or upgrade once in a while when desired. The reason that the data queue execution can continue without a do loop in batch control is because the automated flexible result summarizing system needs a main program, no matter how simple, it shouldn't quit before completing the whole data queue run that may be only 10 cases, or 20000 cases. There is no limit as long as the disk space is large enough. Let us now turn further attention to the purpose of file assignment of the main program, also called executive driver, component 301 in FIG. 3, a listing of this driver is given in FIG. 3a. In FIG. 3a, 330 to 336, about one half dozen files are opened. In all there are three or more data files 330, 332, 333 (or plus 336) to handle input and output requirement, one session log file 331, one plt (plot) file 335, and one scratch file 334. The scratch file allow input parameter modification made at run time and execute again per logical control to achieve dynamic iteration objective. Another important file in FIG. 3a is the session log file called S1.log. The objective of session log file is to save user's effort to avoid needless repetition, particularly for the complex undertaking. Suppose that one did two hours interactive computing and suddenly detected one input decimal error. Say 10.0 was entered as 100. Without log file, one has to redo the whole thing again. With log file in hand, one simply edits S1.LOG file, change 100. to 10.0 and execute a batch run with corrected S1.LOG. These are about the minimum requirements to maintain the needs for great majority of solvers to work under standardized condition to fulfill the free maneuver of flexible computational automation. These allow user and computer maintain dynamic communication link with multiple channels: free symbolic-numeric statement, computer guided symbolic-numeric data input, conventional sequential modified for manual input operation and machine input operation. FIG. 5 shows the main menu where the aforementioned communication channel can be reached. In FIG. 5: 501 shows sequential order (conventional) input; for this option it allows a dual usage, a sequential as normally seen and an extended sequential designed for flexible computational automation. The latter requires adding a number of numerical codes to convey the information for 1. name(s), code name(s), and numbers for active parameter(s) used in parametric study. 2. number of cases to be computed. 3. name(s), code name(s), and number of output functions to be summarized in output report. To make both options share the same input statement, a switch (flag) is added at the end of normal conventional sequential input requirement. For manual session a code number 0 is added to terminate the input; for automated session a code number 1 is added to signal continuation (see example on page A4 about flag for automated input). 502 shows input choice for computer guided symbolic-numeric option to which FIG. 7 shows how it works: namely, 701 shows computer reminder list for items remaining to be inputted; 702 prompts for input; 703 users input; 704 computer's confirmations; 705 another computer reminder list printed, etc. 504 is the most versatile channel for symbolic-numeric communication; one can do many things in various forms of communicational short-cut which conventional way can not do without a preprogramming requirement on a case to case basis. Specific rules of input are given in the section Rules of Input. Examples of operations are shown in Appendix 2. 506 is designed for helping users to gain better insight and higher confidence to resolve problems when doubt arises about the validity of the numerical outcome. FIG. 6a and FIG. 6b show two exemplar cases for respective objectives that give users the backup they deserve. Only with such backup, the popular statement of disclaimer: "users must verify their own results" can have real meaning. The main program, also called executive driver, as we already stated is assigned a number of files for all various purpose so that every bit of human effort will be treasured and preserved. Such driver reflected in a very simple form of being accessible to the free user-machine communication by means of unique symbolic-numeric input channel that can reach every solver and objective task directly and freely after each and every solution session means an important dynamic feature for the program. All the building blocks, namely objective task programs, can be called and executed in interactive mode but also can speed up all manual key-in procedure into electronic speed through running session log file of 100% natural to 100% man-made or machine generated just like parametric study's input queue. This created a new capability at users level to create their own intelligent advanced algorithms based on how to arrange orders of parameters' updating and solver's execution, and allowing the desired target result to be approached iteratively. Taking advantage of both vast capability of symbolic-numeric communication and recycling log file's session in whole, in part, or in combination of several of them, edited or as is; high degrees of computational-automation-of- computational-automation can be merged in a miracle. Now, FIG. 3c the excerpts of practical example (see pages A8 and A9 for user's input requirement for this particular example) for 100% machine generated parametric study input queue will be explained in detail. First of all, it should be notice that when running computational automation class programs, all programs look alike, it always bring users to the same main menu (FIG. 5) where input option can be chosen; in 350, the input data 1 means that the main menu's task item No. 1 is chosen, that is sequential input option. The second line reads 1, 4, 4 at 351 are the first set of input for coefficients A, B, C of a quadratic equation; these three input numbers are the active parameters for this problem. The next seven numbers in the 352 are explained in page A4 for the demo problem. They are the spring mass model parameters (1,1,1,1,1), scaling factor (1), and iteration tolerance (1$e$–9). They are now dummy input. The reason of having these numbers there, is because the program is designed to solve quadratic equation with six options either solving in terms of equation or in terms of spring-mass math model. And from the latter it can automatically convert the math model parameters to equation parameters; such as shown in the demo problem listing at near the bottom of the page. The conversion of input to equation parameters are 1, 4 and 3. Here no more attention will be directed to this inactive part. The last input in 352 is the sequential input switch. The value 1 indicates the machine input option; that means extra inputs (shown in 353 and 354) to characterize the parametric study's active variable code name list (2,3), output results function code list (11,13), as well as the number of total cases (10) to be computed, number of input parameters and output functions (2,2), and the names of output functions (X1R X2R) requested. There are six zeros in the line, each symbolizes the remaining selections not chosen. In 355, the number 4 means menu item selection after finishing the input. Menu task 4 is to request the choice of symbolic-numeric input revision and objective automation; after such input option is prompted by the computer, the 356 contains user's input: EXEC 2, stands for "EXECute with solver No. 2". This completes the one input case. FIG. 3c shows only case 1, case 2 and case 10, 357 stands for similar cases not shown. After finishing all cases, the last input calls menu item 8 which means to exit the program. Therefore, the writing of such input queue file to request either for computing 10 cases or for 1,000,000 cases is just a matter of hitting input key 0 five times more; yet on the computer end, the difference is non-trivial. With such power at finger tip, the extremely costly computations become virtually labor free, nothing needs to be worried about for the rest of procedures except the output requirement, namely: How many output functions one needs computer to compute and to deliver in summarized numerical and graphical forms? If for 10 cases only, there is nothing to be concerned about. If for 1 million cases, one must think twice about what should be included and what shouldn't be. Because of such implication, that is why input simplicity, the building block strategy of objective task operations, as well as modified sequential input requirement to accommodate the communication at run time for the flexible output requirement, all allow no weak point. Any lousy link in this magnitude of automation will make automation worthless! Now, it becomes clear that the powerful automation can do both ways, help or hurt. If only the help is desired, the truth reflected in Alexander Pope's classic line, "A little learning is a dangerous thing" must be carefully listened, and Voodoo practice of large scale computing must be prohibited. This, then gives users no choice but making the effort to gain insight. Thus, this invention deliberately designs a system that can nurture and inspire users to undertake such challenge. There is no doubt in my mind that the true prosperity in computer age must rely on computer users' own brain and own wisdom. A leader in large scale automation must know what he or she is doing. Followers can just obey the rules as long as the system is normal. For this reason the flow diagram include active users at component 316, and their contributions merges into the system from the location 317. All activities in the system are initiated and inspected from there.

Figures 4A, 4B:
FIG. 4a The available input options.
FIG. 4b The sequential input switch.

Finally, it is appropriate to summarize briefly about the further intentions and benefit for the exemplar innovative features offered by this invention as shown in FIGS. 4a through 4f. FIG. 4a shows three available input options. 421, sequential input with switch (see also FIG. 4b. 424 shows interactive mode; 425 shows machine input mode) is aimed to support flexibility required to cope with advance maneuvers in computational automation and still be able to use the same code without designing one code for automation, another for interactive run. 422, computer-aided symbolic-numeric input helps a novice break the ice. As so frequently, not knowing how to input is the greatest barrier that keeps one from the benefits of computerized tools. 423, the free symbolic-numeric input allows users' control from data updating to all kinds of advanced computational maneuvers to greatly expand users' outreach and insight accumulation. The latter is nurtured through practicing decision making on the users' part. Therefore, the multiple choices of inputting options are not just for the users' simple convenience, but rather for the far reaching implications relating to who is qualified to use the tool, how easy, how reliable, and how powerful the tool can be accessed. FIG. 4c shows the available task forms. 426, the simple form which is the normal practice. 427, the combinative form which allows computer to do multiple tasks one after another. The effect is significant in both ways—to boost outreach of automation as well as to bring user into the loop of computations as an insider to oversee without risk of "to err is human". 428, the derivative form not only brings the computational flexibility into a greatly expanded horizon, but also taps the user's human wisdom to benefit from insight feedback unachievable by other form of automation. FIG. 4d shows two available output options. 429, the default option is same as conventional. 430, the selective option allows users to make free decisions at run-time about what output functions are selected to be examined for parametric effect. This flexibility is important to the economic usage of computational automation on the one hand to avoid suffocation by limited resources and to cope with super large problems, and on the other hand to not spend any effort on information in areas without justified interest. FIG. 4e shows the available solution options for the computational automation system. 431, the default option is the same as conventional solvers except that it runs in the system environment as described. 432, the alternative solution method(s) allows comparison to be made for helping user's judgement against spurious solutions. 433, the transparent box is provided for user's inspection on critical computational areas to help judge the evidence of computational quality, an option justified particularly when case 432 is not available. FIG. 4f shows the available objective tasks function levels. 434 is simplistic level for execution of one object at a time. 435 is static automation level when computational automation looping requirement can be predetermined. 436 is dynamic automation level when computational automation looping requirement is based on logical and numerical constraints determined by the computational outcomes. Therefore, the benefits obtainable by this invention with aforementioned, deliberately designed, options have created an immensely new computational environment that is significantly different from the old.

APPLICATIONS

The Likely Outcome of Current Reverse Incentives.

A tool, like a better mouse trap, is emerging. To weigh the effort to do so versus the long term benefits that can be gained, the prospect of long term widespread application in engineering analyses, program tests, and education is expected. However, how to overcome the near term shadow of negative incentive is a good question that was also asked by Mencius more than 2300 years ago: "How could the kingdom be ruled?"—if deceit is encouraged.

Who Is Qualified to Use It?

Examples have shown that without numerical ill-conditions or human error, computer method is far more accurate than hand calculations. Since the syndrome expressed in graphical form is simple and straight forward, it does no harm to let designers take care of decisions when results should be rejected based on programs that can provide such warnings without much effort. In this way the designer's computational safety is guaranteed by sound science based on reliable procedural automation to extract the computation's own power and own evidence. Such option of computational supervision is far superior to hand analysis or sending designers back to use pre-computer age technology to contradict the analytical team's effort. Computing with up-to-date technology is important to eliminate double effort and double standards. It is also important to waive procedural matters, but not to waive the use of the users own reasoning power to examine proofs achievable from extended computing power within the easy reach of designers. To uphold the human's position in charge, powerful computing tools must be used by all who need them to gain understanding and confidence; and not to take computer results for granted in any form.

Coping With The Requirement "Users Must Verify Their Own Results"

The ability to test numerical confidence by at least one means is of supreme importance. The fact that very primitive slide rules that can hardly read more than 3 digits was good enough to create engineering confidence by our predecessors was not accidental. Every step of the computations was under the engineer's direct supervision. Prior to the computer age engineers would double check their results before being accepted as final. The electronic checking of results with the same solver is meaningless. This invention makes it standard that the computerized computation should be provided with no less than two options of result checking that include: a. Providing an alternative solver or inspection of crucial areas of computation at turnkey convenience. b. Providing parametric study and summary automation under the user's active control by a single line of symbolic-numeric statement and answering questions on the desired graphical requirements. Such check and the desirable design parameters' selection merge into one useful option. The importance for the ability to do so without major effort on user's part makes the warning "Users must verified their own results" workable by designers. Such option also enables one: i. To compare two programs to determine which one is better. ii. When to trust or not to trust computer output. The unlimited extension of massive scale computing tasks automation tends to make unaffordable computations affordable, and unqualified users qualified. All are accomplishable through global objective programming that treats the user's pain the same as the developer's own pain, and solving with the software developer's foresight and programming options at hands.

The Dream Tool For Education Is Now Available.

The harm of voodoo trust of computer are relatively difficult to explain in the past. This invention has made the explanation easy and can show that the voodoo is bad. Two simple examples are given:

FIG. 1 shows the importance for finding the solver's good numerical condition to a problem as simple as solving a quadratic equation. Prominent mathematician George Forsythe warned in his paper, "Solving a Quadratic Equation on a Computer" (A Collection of Essays, pp. 138–152, MIT Press, 1969) that sometimes even the mightiest computer may fail to deliver a good solution for finding two roots of a quadratic equation. He, therefore, suggested that some practical aspects of computation should be everyone's basic education in mathematics. This invention upgrades Forsythe's warning to engineers: A solver can be trusted if one is already sure that one is computing within good numerical ranges. With quadratic equations for example, the bad numerical range isn't just a function of the elegance level of an algorithm, but also the programming language compiler's version. The threshold of trouble for some programs occur when input equation coefficients (when A=1) B and C are greater than 1E5. Others programs won't have difficulty even at 1E30 or higher. Thus, those who care about the computer's safe usage in engineering can not afford not to know the distinction between an elegant code and an inferior code, the language compiler's version, as well as the existence of the trouble threshold of numerical range for a specific mathematical formulation. Engineers who care about safety need to know more about the way nature traps people in the areas of technological significance. Namely, conventional solvers frequently turn out to be the worst possible solvers; the smaller roots in trouble happened to be the far more influential roots in trouble. Not big roots, but rather these smaller ones dominate system dynamic characteristics that determine the survivability of hardware systems in the event of impact, shock, vibration or buckling!

FIG. 2-a shows similar issues in computation for stresses. It demonstrates that curved-beams' textbook formulas for bending stress have a terribly narrow range of good numerical conditions which deteriorate quickly as the radius of curvature increases. FIG. 2-b shows an alternative formulation that removes such danger. Thus, when such automated computational power is under the designer's easy disposal, the hidden danger of theoretically correct code and theoretically correct input leading to outrageous output can be scientifically detected and prevented. Once the good numerical ranges are known, one can compute and accept the results with confidence and without testing. Furthermore, which one is a better design? Better computing algorithm, or a better programming compiler? The sample evidence clearly demonstrate that there is no sense testing the safety, when the results are clearly obtained inside the numerical garbage range (like FIGS. 1a, 1c and FIG. 2c, and 2d).

EXAMPLES FOR RECOGNIZING THE VALUES OF NEW OBJECTIVE TASKS

The best way to understand the potential of applications for computational automation is to notice the simplicity to fill the gap by objective tasks however simple as long as it helps against human error on one hand. On the other hand, it eases tapping new computational luxuries with simple algorithms permissible per the rules of the entire new ball game. For ease of explanation, a gear pair computation for equal bending strength of gear teeth through rack shift modification is used as an example.

Algorithms for Derivation of Equal Bending Strength of Gear Pair—The Four Point Iteration.

1) Compute two pairs of J-factor at dx apart, say at $x1=0$ and $x2=1$ for gear and pinion. Assume J values computed are y coordinates and values of rack shift are x coordinates.

2) Compute intersection per straight-linear assumption for two J curves. Find the x coordinate at intersection.

3) Recompute two new pairs of J-factor at close-in location of $dx=0.1$, dx distance from the point of last predicted intersection.

4) Repeat 2) and 3) over and over until meeting the pre-determined criteria of tolerance, say $x2-x1<0.00001$.
The automated system can have more than one way to do the same thing like the above algorithms because of its ability to reach results from previous runs. In this way a rather time consuming highly non-linear optimization problem can turn into a relative, straight forward simple procedure. Designers can even do their own shortcut based on the first level of automation available. For example, one only needs to perform two parametric studies in the same range and same number of run cases, one for gear and one for pinion, with rack shift x as active variable. The equal strength design is represented by the intersection point between the two parametric study curves. For higher accuracy, one can do the same again, but only at the close neighborhood of previous point of intersection. As a result, the new tool offers users not only new efficiency, but also new opportunity to tap user's wisdom in another dimension. Both the session log file and input data queue file can be edited and modified to allow more involved iteration to take place in searching for a better design. This offers users a great opportunity to use their wisdom to guide computers for doing the most rewarding numerical system experimentations. Instead of passively waiting computer's black box factory to do iterations in dark, they can participate actively to make computers more productive. For instance, to pursue the computational automation of computational automation, or to design an algorithm that can use minimum number of parametric run cases to reach the most accurate design optimization point is an obvious interesting task within the immediate reach of an average user!

Now, it comes to the point to emphasize the importance of creating very simple objective tasks to protect the investment (time and effort) of automated computation. Eventually, if one can not afford to let computer run a full month to find out later all results are invalid because of a human error in input, one must recognize: Computers are a two way street. While it can save more with proper use, it can also waste more with inappropriate use. Computational automation couldn't afford the latter. Because now computer may be assigned to do 10000 run cases for domain analyses without stop and without intervention of an operator, how could it justify an input mistake? Again, gear strength computation is usd as an example: Modern gears relate with some twenty parameters, but not all independent. This frequently creates troubles when one changes one, like teeth number, but forgets to change another (or changes brought in mistakes), say, outside diameter. This creates a mess frequently. To write a special conventional CAE program for safety assurance is against its own logic. Namely, if one couldn't have confidence to make manual change of input, how could another CAE program help move information from one place to another again in manual method? The automation system proposed doesn't have such contradiction. So, while something like DATA_CHECK objective task is simple and not worth bothering in conventional CAE, it is, nonetheless, important to computational automation. This shift of burden from users to computers is critical. The following statement explains why:

QUEUE T1 35 DATA_CHECK EXEC 2 is a symbolic-numeric input statement which means that the computer should follow the QUEUE instruction to do one thing after another. First thing to do is that the variable T1, the pinion teeth number, is now to be changed from whatever it is to 35; then a data check task should be performed to remove whatever inconsistencies found, but error information must be fed back for user's approval or intervention. Finally the computer is asked to perform gear strength computation using the method designated as No 2. This complete statement saves user's effort and assures input reliability at the same time. This is because the computer is very reliable in handling procedural matters, the human is not.

The Rules of Operation.

Following aforementioned programming structure which assembled the vital components created per steps to fulfill all mission requirements of this invention, a software system designed for computational automation is in order. Now, the operation rules must be added to show how it works. These rule are demonstrative and by no means complete. When rules are obeyed, the writing makes sense just like grammar of a language.

RULES OF INPUT

1. Rules for Sequential Input:

a. Sequential interactive input option selected from outside the main menu keeps the traditional convention intact.

b. Sequential interactive input option selected from the main menu should have a flag of value 0 added at the end to terminate the input.

c. Sequential batch input when designated to automated computations the code must be machine generated with a flag of value 1 at the end to activate the continuation for additional input. These extra inputs are needed to guide the output of summary requirements for parametric runs. The latter shall include the following information: i. the index number representing active input variables, the index number representing requested output function names, the number of case runs to be completed, the number of active variable selected, and the number of output summary curves requested. ii. The output function name tags to be printed on graphs next to the output curves. Such inputs are tedious and shall not be done manually to rule out the chance of "to err is human".

2. The Rule for The Primary Level of Symbolic-numeric Input:

The symbols to be read either represent an active alpha-numeric variable name or symbols of object task names. The variable name input at this level shall be entered in a pair or multiple pairs, such as: X1=xxxxx where X1 is an alphanumeric variable name following ordinary convention. xxxxx represents free format numbers can be in the form of real, integer, or scientific notation. The equal sign, whether it is or isn't in between the symbolic-numeric pair, does not really matter. Also it doesn't matter whether X1 is on the left hand side or right hand side of the equal sign. The only thing that matters is that there is at least one single space separating the pair of variable name and input quantity. The object task name follows the same convention of alphanumeric variable names except the objective task may or may not need to accompany free format numbers depending on the nature of specific objective task. For example: "EXEC n" or "EXECUTE n" where EXEC or EXECUTE means an object task relating to execute a computational solver, and n is a code identification of the solver's method, such as EXEC 2, (which means execute the solver identified as method 2), and EXEC −2, (which means to execute the solver of method 2 and for some sort of special purposes, like equal strength design parameter determination or other automated design iterations for certain optimization purpose). The vocabularies of this kind, with combinative capacity, dramatically increase the overall reach of the user's analytical capacity in computational automation without losing sight of the user's control and supervision. When the rules are set up in global terms, the difficulty for learning how to use a series of programs developed in the same structure, disappears.

3. The Rule for Inputting Multiple Symbolic-numeric Parameters:

It allows multiple pairs of variable input in one line of a statement without subject to pre-programmed restriction.

4. The Rule of Input for Parametric Study:

It also allows performance of parametric studies or other tasks on the basis of one task at a time, such as: "PARAMETRIC (or PARA) 500, A 100 B 1E3 C 1E4 EXECUTE 2 LOOP" means to perform 500 cases of computations with the method No. 2 and using the current data base input by changing parameters A,B,C with increments 100 for A, 1000 for B and 10000 for C for each time of subsequent runs. If EXEC 2 is omitted, the solution method will be defaulted to the current default method. The parametric study prepares 500 input sets for this case and requests graphic output requirement for function values desired to be drawn in parametric curves that allow it to be zoomed for any local detail between points 1 to 500, and to be presented in either points or lines. Once the 500 input data sets are automatically prepared, the execution can be automatically executed one by one in error-free automation.

5. The Rule for Inputting QUEUE objective task:

The secondary level of symbolic-numeric read required to notify the computer that task read can be repetitive. This then allows the computer to execute objective tasks one by one until finally it leads to a computation. "QUEUE T1 20 T2 40 DATA_CHECK EXEC 1" means that one wants to update the value of T1 to 20 and T2 to 40, then perform data checks to resolve the internal data contradiction problem first before making computations with solver method coded as No. 1. Such an update requirement arises in cases when the data set contains parameters which are the function of other more basic independent parameter. An example, is a gear blank diameter as a function of gear tooth number. That analytical input has neither all independent parameters, nor perfect dependent parameters where changing one automatically updates another. For the manual input process, the data consistency check must be done manually. For automated computation, sandwich with manual computation and manual update not only greatly slows down the process, but adds to potential weak spots by inviting human error. In order to benefit from computational automation, either a special purpose program beyond basic solvers be developed for each specific purpose, or only various task objective programs are developed. A full automated computation benefit can be achieved with the ability to use combinative options of basic solvers and other procedural objective task programs. Thus, the differences among partial manual involvement, freedom of using combinative objective tasks option, and the special purpose programs are significant. It is not just a matter of economics and productivity, but also a matter of being with or without engineering confidence at stake. The latent cost to reduce such uncertainty can be very expensive and pain staking.

BEST MODE FOR CARRYING OUT THE INVENTION

With the drastic shift of procedural burden to the machine, engineers can afford to spend time on what the machine is less flexible and less capable of doing: Gaining insight and then turning that insight into a correct engineering decision. The virtue of the sense of responsibility is the human's special gift which is difficult to program for automation. For this reason the computational tool should provide means to enhance the human's ultimate decision making power for the sake of both safety and human creativity. The system environment automation and standardization induced computational power and operational convenience have clearly opened up a new horizon that engineers and designers can claim back the analytical tool they lost. What remains unresolved, is the right incentive to support the right effort permissible by the technology. With the means of computational automation in place, the means of computational automation of computational automation is virtually at hands of users and programmers. The education about what computer can do and can not do will be the key to turn the tide around. This invention can easily fulfill that mission with rationale and evidence, but no mandate. If the negative incentive is too stubborn to be removed, then, through the evolution of the nature, the "lawful deceptions" will collapse eventually under its own weight as painful lessons mount. Mainly the powerful computational tool remains powerful only if the incentive is right. Otherwise, the contrary is true.

APPENDIX 1  DECODER PROGRAM LISTINGS

The decoder that decodes the meanings of tasks and the purpose of input quantities for the primary level and prompts the actions is listed in the subroutine PDECODER.

The subroutine SDECODER decodes the meanings of tasks and the purpose of input quantities for the mixed tasks and numbers more than one engagement possible. This allows computer to read in mixed symbolic numeric input at run time and to perform various assignments on task after another.

```
C ******************** PDECODER******************************
C NOTES:  The following logical structure can be adapted in any
C         programing language in consistent with existing solvers
C         adopted for the programs to be developed.
C  1. All small characters are dummies to be replaced by symbolic
C     names of variables, symbolic names of objective tasks, or
C     numeric numbers in real programs.
C  2. In the following text, xx represents an integer equal to or
C     greater than the maximum number of active input variables
C     involved (N); cccc represents distinct input parameter
C     names; ccccc(x) represents the solver control task, where x
C     represents solver selection code, a positive integer
C     indicates a basic solver, a negative integer indicates
C     iterative usage of the same basic solver for some special
C      purposes.
C***************************************************************
      SUBROUTINE PDECODER(NC,NN)
      COMMON /CARD/ A0(xx),S0(xx)
      COMMON /DBASE/S(xx),IND(xx)
      INTEGER A0,NAME(xx),TASK1,TASK2,TASK3,....TASKN,IJ(1),
      INTEGER PARA,.......
      EQUIVALENCE (S(1),IJ(1))
      DATA NAME(1)/4Hcccc/
      DATA NAME(2)/4Hcccc/
      DATA NAME(3)/4Hcccc/
      DATA NAME(4)/4Hcccc/
      DATA NAME(5)/4Hcccc/
      .......ditto
      .......ditto
      DATA NAME(N)/4Hcccc/
C Some typical standardized objective tasks symbol, symbol
C length is an option. The symbol standardization eases user's
C learning.
      DATA LOOP,PARA,SWIT,AUTO,DATA/4HLOOP,4HPARA,4HSWIT ,4HAUTO,
     14HDATA/
```

```
      DATA QUEUE,EXEC,OUTP,QUIT,TYPE/4HQUEU,4HEXEC,4HOUTP,4HEXIT,
     14HLIST/
      DATA MAIN/4HMENU/, ........
       IF(A0(1).EQ.QUEUE) THEN
      CALL SDECODER(NC,NN)
      RETURN
       ENDIF
       IF(A0(1).EQ.task1) THEN
      CALL task1program
      RETURN
       ENDIF
       IF(A0(1).EQ.task2) THEN
      CALL task2program
      RETURN
       ENDIF
       IF(A0(1).EQ.EXEC) THEN
C The solvers' control task.  This brings the computer result
C verification within user's easy reach.
      CALL ccccc(x)
      RETURN
      ENDIF
C Other objective tasks
      ...........ditto
      ........
C The last objective task
       IF(A0(1).EQ.taskn) THEN
      CALL tasknprogram
      RETURN
       ENDIF
C The remaining items expected are input variables where each
C symbolic name must accompany a numerical quantity. If not, a
C warning will be issued.
       IF(NC.NE.NN) CALL ERCOM4
      DO 90 I=1,NC
      DO 80 J1=1,N
       IF(A0(I).EQ.NAME(J1)) GOTO 81
   80 CONTINUE
      GOTO 90
C The input register serves the purpose for guiding input with
C symbolic list based on the information collected in IND array
C here.
   81 IND(J1)=1
      S(J1)=S0(I)
   90 CONTINUE
C TO update input data in database files.
      CALL WFILE(4,1)
   99 RETURN
      END
```

```
C------------------ SDECODER-------------------
C SDECODER IS A SECONDARY LEVEL DECODER FOR SYMBOLIC-NUMERIC
C INPUT TO INSTRUCT COMPUTER TO PERFORM ONE TASK AFTER ANOTHER
C FOLLOWING THE TERM "QUEUE". THE QUEUE INPUT STATEMENT ALLOWS
C A FLEXIBLE AUTOMATION TO GAIN IMMENSE COMPUTING POWER,
C RELIABILITY, AND EASE OF LEARNING WITHOUT ADDING PROGRAMMING
C BURDEN.
C ----------------------------------------------------------------
      SUBROUTINE SDECODER(NC,NN)
      COMMON /CARD/ A0(xx),S0(xx)
      COMMON /DBASE/S(xx),IND(xx)
      INTEGER A0,NAME(yy),TASK1,TASK2,TASK3,....TASKN,IJ(1),
      INTEGER PARA,.......
      EQUIVALENCE (S(1),IJ(1))
      DATA NAME(1)/4Hcccc/
      DATA NAME(2)/4Hcccc/
      DATA NAME(3)/4Hcccc/
      DATA NAME(4)/4Hcccc/
      DATA NAME(5)/4Hcccc/
      .......ditto
      .......ditto
      DATA NAME(N)/4Hcccc/
C Some typical standardized objective tasks symbol, symbol
C length is an option. The symbol standardization eases user's
C learning.
      DATA LOOP,PARA,SWIT,AUTO,DATA/4HLOOP,4HPARA,4HSWIT,4HAUTO,
     14HDATA/
      DATA QUEUE,EXEC,OUTP,QUIT,TYPE/4HQUEU,4HEXEC,4HOUTP,4HEXIT,
     14HLIST/
      DATA MAIN/4HMENU/,.........
      DO 10 I=1,NC
      A0(1)=A0(I)
        IF(A0(1).EQ.task1) THEN
      CALL task1program
      GOTO 10
        ENDIF
        IF(A0(1).EQ.task2) THEN
      CALL task2program
      GOTO 10
        ENDIF
        IF(A0(1).EQ.EXEC) THEN
      CALL ccccc(x)
      GOTO 10
        ENDIF
C Other objective tasks         ..........ditto
      ..........ditto
C The last objective task.
        IF(A0(1).EQ.taskn) THEN
      CALL tasknprogram
      GOTO 10
```

```
      ENDIF
C To modify input parameters in conjunction with other
C objective tasks.
      DO 90 I=1,NC
      DO 80 J1=1,N
      IF(A0(I).EQ.NAME(J1)) GOTO 81
   80 CONTINUE
      GOTO 90
   81 S(J1)=S0(I-1)
   90 CONTINUE
C To update input data in database files
      CALL WFILE(4,1)
   10 CONTINUE
   99 RETURN
      END
```

APPENDIX 2   SIMPLE DEMO RUN

This Appendix shows the excerpts of a computer run for solving
simple quadratic equations with six options either by closed form
formulas or by direct iteration based on a math model.

PLEASE CHOOSE ONE OF THE DESIRED INPUT TASKS:

TASK 1--- SEQUENTIAL ORDER (CONVENTIONAL) INPUT.
  TASK 2--- RANDOM ORDER (SYMBOLIC+NUMERIC) INPUT.
  TASK 3--- LIST CURRENT INPUT DATA.
  TASK 4--- PARAMETRIC STUDY, DIRECT INPUT REVISION & OBJECT TASK AUTOMATION.
  TASK 5--- MAIN PROGRAM EXECUTION.
  TASK 6--- OPTIONAL SOLUTION WITH ALTERNATIVE THEORY & METHODS
  TASK 7--- ERASE OLD FILES, STARTING NEW PROJECT (OPTIONAL)
  TASK 8--- EXIT THE PROGRAM.
  ENTER TASK NO.: --> 1

ENTER A,B,C,I0,I1,I2,K1,K2,SF,EPS,LL1,-- WHERE

A,B,C = COEFFICIENTS OF QUADRATIC EQUATION; THE REST ARE
OPTIONAL QUADRATIC EIGENVALUE SYSTEM SIMULATION INPUT
WHERE: I0= THE MID MASS OF A MASS-SPRING-MASS-SPRING-MASS SYS.
       I1,K1= THE MASS AND SPRING-CONSTANT OF ONE SIDE.
       I2,K2= THE MASS AND SPRING-CONSTANT OF THE OTHER SIDE.
       SF= SCALING FACTOR, DEFAULT TO 1 IF 0 IS ENTERED.
       ESP= ITERATION TOLERANCE DEF. TO 1.E-9 IF 0 IS ENTERED.
       LL1= FLAG FOR AUTOMATED INPUT: 1=ACTIVE, 0=IGNORED.
 0 0 0 1 1 1 1 1 1 0 0

THE INPUT DATA ARE:

| | | | |
|---|---|---|---|
| A | .100000000000000E+01 | * | COEFFICIENT OF X**2 TERM---------- 1 |
| B | .400000000000000E+01 | * | COEFFICIENT OF X TERM ------------ 2 |
| C | .300000000000000E+01 | * | COEFFICIENT OF CONSTANT TERM------ 3 |
| I0 | .100000000000000E+01 | * | INERTIA OF JUNCTION ROTOR--------- 4 |
| I1 | .100000000000000E+01 | * | INERTIA OF LEFT END ROTOR--------- 5 |
| I2 | .100000000000000E+01 | * | INERTIA OF RIGHT END ROTOR-------- 6 |
| K1 | .100000000000000E+01 | * | LEFT-SIDE SPRING CONSTANT--------- 7 |
| K2 | .100000000000000E+01 | * | RIGHT-SIDE SPRING CONSTANT-------- 8 |
| SF | .100000000000000E+01 | * | SCALING FACTOR FOR K1 & K2(DF TO 1)9 |
| EPS | .100000000000000E-08 | * | ITERATION TOLERANCE(DF TO 1.E-9)--10 |

HIT ANY KEY TO CONTINUE

PLEASE CHOOSE ONE OF THE DESIRED INPUT TASKS:

TASK 1--- SEQUENTIAL ORDER (CONVENTIONAL) INPUT.
TASK 2--- RANDOM ORDER (SYMBOLIC+NUMERIC) INPUT.
TASK 3--- LIST CURRENT INPUT DATA.
TASK 4--- PARAMETRIC STUDY, DIRECT INPUT REVISION & OBJECT TASK AUTOMATION.
TASK 5--- MAIN PROGRAM EXECUTION.
TASK 6--- OPTIONAL SOLUTION WITH ALTERNATIVE THEORY & METHODS
TASK 7--- ERASE OLD FILES, STARTING NEW PROJECT (OPTIONAL)
TASK 8--- EXIT THE PROGRAM.
ENTER TASK NO.: -->5

A=  .100000000000E+01 B=  .400000000000000E+01 C=   .300000000000000E+01
 ONE PAIR OF REAL ROOTS ARE:
      -1.000000        -3.000000
 THE FUNCTION VALUES ARE
   0.00000000E-01    0.00000000E-01

PLEASE CHOOSE ONE OF THE DESIRED INPUT TASKS:

TASK 1--- SEQUENTIAL ORDER (CONVENTIONAL) INPUT.
TASK 2--- RANDOM ORDER (SYMBOLIC+NUMERIC) INPUT.
TASK 3--- LIST CURRENT INPUT DATA.
TASK 4--- PARAMETRIC STUDY, DIRECT INPUT REVISION & OBJECT TASK AUTOMATION.
TASK 5--- MAIN PROGRAM EXECUTION.
TASK 6--- OPTIONAL SOLUTION WITH ALTERNATIVE THEORY & METHODS
TASK 7--- ERASE OLD FILES, STARTING NEW PROJECT (OPTIONAL)
TASK 8--- EXIT THE PROGRAM.
ENTER TASK NO.: -->6

THE FOLLOWING OPTIONS ARE AVAILABLE IN SOLUTIONS:

1. BY SINGLE PRECISION AND CONVENTIONAL FORMULA;
2. BY DOUBLE PRECISION AND CONVENTIONAL FORMULA;
3. BY SINGLE PRECISION AND NON-CONVENTIONAL FORMULA;

4. BY DOUBLE PRECISION AND NON-CONVENTIONAL FORMULA;
5. BY MEANS OF PHYSICAL EVENT SIMULATION IN SINGLE PRECISION ARITHMETICS;
6. BY MEANS OF PHYSICAL EVENT SIMULATION IN DOUBLE PRECISION ARITHMETICS;
7. TO ALLOW NEW INPUT;
8. TO OPEN SYMBOLIC-NUMERICAL CHANNEL OF COMMUNICATION;
9. TO RETURN TO MAIN MENU.

PLEASE ENTER YOUR CHOICE:
6

```
   THE CHARACTERISTICS EQUATION IN QUADRATIC FORM IS:
   X**2 +         4.000000000000000*X +        3.000000000000000 = 0.
   THE SYSTEM HAS NO EIGENVALUE BELOW        1.000000000000000
   THE SYSTEM HAS ONE EIGENVALUE ABOVE       1.000000000000000
   ALL OTHER EIGENVALUES ARE EACH LOCATED BETWEEN ONE
      ADJACENT PAIR OF THE FOLLOWING SERIES:
         1.000000000000000
         1.000000000000000
U,F1,UL,UH:  -.3000000E+01   -.1000000E+02   -.1000000E+01
U,UL,UH=         -3.000000000000000        -10.000000000000000
       -1.000000000000000
  WARNING: INI. TRIAL V.INVALID
U,F1,UL,UH:  -.3000000E+01    .0000000E+00    .0000000E+00
U,UL,UH=         -3.000000000000000   0.000000000000000E+000
    0.000000000000000E+000
   THE ROOTS OF EIGENVALUES LISTED IN ASCENDING ORDER ARE:
         1.000000000000000
         3.000000000000000
   THE NATURAL FREQUENCY IN CYCLE PER MINUTE ARE:

16.539866862653760
```

THE FOLLOWING OPTIONS ARE AVAILABLE IN SOLUTIONS:

1. BY SINGLE PRECISION AND CONVENTIONAL FORMULA;
2. BY DOUBLE PRECISION AND CONVENTIONAL FORMULA;
3. BY SINGLE PRECISION AND NON-CONVENTIONAL FORMULA;
4. BY DOUBLE PRECISION AND NON-CONVENTIONAL FORMULA;
5. BY MEANS OF PHYSICAL EVENT SIMULATION IN SINGLE PRECISION ARITHMETICS;
6. BY MEANS OF PHYSICAL EVENT SIMULATION IN DOUBLE PRECISION ARITHMETICS;
7. TO ALLOW NEW INPUT;
8. TO OPEN SYMBOLIC-NUMERICAL CHANNEL OF COMMUNICATION;
9. TO RETURN TO MAIN MENU.

PLEASE ENTER YOUR CHOICE:

8
A=   .1000000000000000E+01  B=   .4000000000000000E+01  C=   .3000000000000000E+01

THE CURRENT INPUT STATUS IS LISTED BELOW:

THE INPUT DATA ARE:

```
    A      .100000000000000E+01 *  COEFFICIENT OF X**2 TERM---------- 1
    B      .400000000000000E+01 *  COEFFICIENT OF X TERM ------------ 2
    C      .300000000000000E+01 *  COEFFICIENT OF CONSTANT TERM------ 3
    I0     .100000000000000E+01 *  INERTIA OF JUNCTION ROTOR--------- 4
    I1     .100000000000000E+01 *  INERTIA OF LEFT END ROTOR--------- 5
    I2     .100000000000000E+01 *  INERTIA OF RIGHT END ROTOR-------- 6
    K1     .100000000000000E+01 *  LEFT-SIDE SPRING CONSTANT--------- 7
    K2     .100000000000000E+01 *  RIGHT-SIDE SPRING CONSTANT-------- 8
    SF     .100000000000000E+01 *  SCALING FACTOR FOR K1 & K2(DF TO 1)9
    EPS    .100000000000000E-08 *  ITERATION TOLERANCE(DF TO 1.E-9)--10

ICL= 0; ICN ARRAY=  1 1 1 1 1 1 1 1 1 1
 THE INPUT DATA HAVE BEEN COMPLETED.
PLEASE ENTER SYMBOLIC+NUMERICAL INPUTS OR EXPRESS-TASK COMMAND
 (Separate symbol and number with Space, Comma, or Equal-sign):

QUEUE C 4 EXEC 2

THE INPUT QUANTITY FOR C    IS   .40000000E+01
A=  .100000000000E+01 B=   .400000000000000E+01 C=   .400000000000000E+01
  THE TWO REAL ROOTS ARE:
       -2.000000000000000        -2.000000000000000
  THE FUNCTION VALUES ARE:
      (0.000000000000000E+000,0.000000000000000E+000)
      (0.000000000000000E+000,0.000000000000000E+000)

THE FOLLOWING OPTIONS ARE AVAILABLE IN SOLUTIONS:

1. BY SINGLE PRECISION AND CONVENTIONAL FORMULA;
2. BY DOUBLE PRECISION AND CONVENTIONAL FORMULA;
3. BY SINGLE PRECISION AND NON-CONVENTIONAL FORMULA;
4. BY DOUBLE PRECISION AND NON-CONVENTIONAL FORMULA;
5. BY MEANS OF PHYSICAL EVENT SIMULATION IN SINGLE PRECISION ARITHMETICS;
6. BY MEANS OF PHYSICAL EVENT SIMULATION IN DOUBLE PRECISION ARITHMETICS;
7. TO ALLOW NEW INPUT;
8. TO OPEN SYMBOLIC-NUMERICAL CHANNEL OF COMMUNICATION;
9. TO RETURN TO MAIN MENU.

PLEASE ENTER YOUR CHOICE:

8
A=  .1000000000000000E+01 B=   .4000000000000000E+01 C=   .4000000000000000E+01

THE CURRENT INPUT STATUS IS LISTED BELOW:

THE INPUT DATA ARE:

A      .100000000000000E+01 *  COEFFICIENT OF X**2 TERM---------- 1
    B      .400000000000000E+01 *  COEFFICIENT OF X TERM ------------ 2
    C      .400000000000000E+01 *  COEFFICIENT OF CONSTANT TERM------ 3
    I0     .100000000000000E+01 *  INERTIA OF JUNCTION ROTOR--------- 4
    I1     .100000000000000E+01 *  INERTIA OF LEFT END ROTOR--------- 5
```

```
 IV2    .100000000000000E+01 *  INERTIA OF RIGHT END ROTOR--------  6
 K1     .100000000000000E+01 *  LEFT-SIDE SPRING CONSTANT---------  7
 K2     .100000000000000E+01 *  RIGHT-SIDE SPRING CONSTANT--------  8
 SF     .100000000000000E+01 *  SCALING FACTOR FOR K1 & K2(DF TO 1)9
 EPS    .100000000000000E-08 *  ITERATION TOLERANCE(DF TO 1.E-9)--10

ICL= 0; ICN ARRAY=  1  1  1  1  1  1  1  1  1  1
 THE INPUT DATA HAVE BEEN COMPLETED.
PLEASE ENTER SYMBOLIC+NUMERICAL INPUTS OR EXPRESS-TASK COMMAND
 (Separate symbol and number with Space, Comma, or Equal-sign):

PARAMETRIC 10 B 1 C 1 EXEC 2 LOOP

YOU CAN SELECT THE GRAPHIC CURVES DESIRED BY NUMBER
 DEFAULT TO 4 IF C/R. VALID OUTPUT VARIABLE NAMES ARE:
 X1R=(11) X1I=(12) X2R=(13) X2I=(14) FQ1=(15) FQ2=(16)
 F1R=(17) F1I=(18) F2R=(19) F2I=(20)
 PLEASE ENTER (< OR = 5; ENTER 0 FOR A DEFAULT OF 4):/
2
 ENTER OUTPUT VAR. NAME (OR No.)ONE BY ONE AS DIRECTED:
 ENTER NO.         1  OUTPUT VARIABLE NAME:
X1R
 ENTER NO.         2  OUTPUT VARIABLE NAME:
13

IF YOU HAVE TAKEN ZOOM OPTION BEFORE, YOU NOW CAN MAKE
A CHOICE BETWEEN:
   a. ENTER 0 (ZERO) FOR FULL GRAPHIC OUTPUT;
   b. ENTER 1 FOR (ZOOM OPTION) LOCAL GRAPHIC OUTPUT.
OTHERWISE ENTER 0 (ZERO) ONLY.
0
        2
       10
       10
X1R  X2R
INPUT X LENGTH (UP TO 639 MAX, DEF. TO 498 IF 0 IS ENTERED:
0
INPUT Y LENGTH (UP TO 479 MAC, DEF. TO 373 IF 0 IS ENTERED:
0
INPUT CENTER COORD.(XC,YC) OF FRAME,ENTER 0,0 FOR DEF.:
0,0
INPUT X TITLE--UP TO 62 CHAR./LINE FOR 3 LINES:
 INPUT X AXIS TITLE:
XXXXX
 ENTER 1ST LINE OF BOTTOM TITLE:
AAAAAA
 ENTER 2ND LINE OF BOTTOM TITLE:
BBBBBBB
 INPUT Y-AXIS TITLE:
YYY
```

```
X-MIN          4.000000000000000    X-MAX=        13.000000000000000
Y-MIN=       -11.908330000000000    Y-MAX=        -1.091673000000000
INPUT PLOT SELECTION--1 FOR DOT-, 2 FOR LINE- PLOT:
2
```
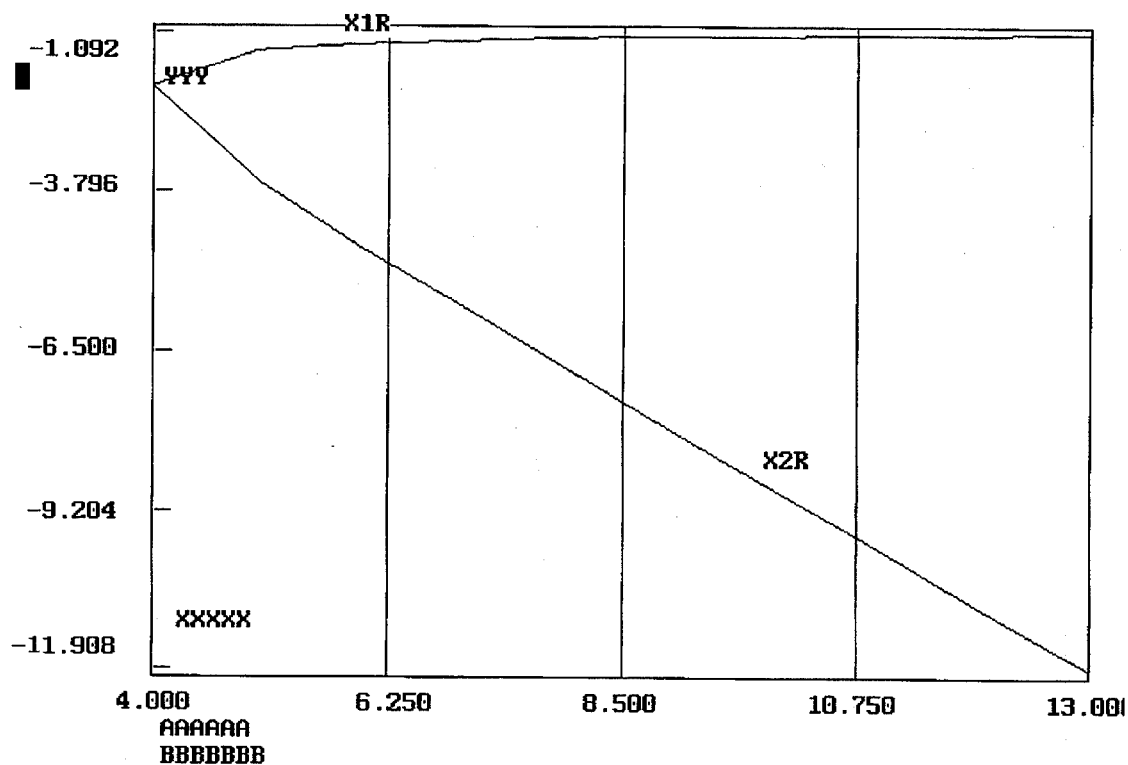

We claim:

1. A computational automation system comprising:

a) an executive driver which is a main program of a computing system that maintains a plurality of files opened to support the mission of computational automation, which allows a very large number of executions of various objective tasks, computational or non-computational, for an entire session until calling for exit by user's menu choice;

b) a symbolic numeric interpreter means that reads in input as character string and decomposes the string into symbols and numeric quantities ready for decoders to process further;

c) a pair of decoding means comprising means for determining the content of the symbolic-numeric input and means for organizing system actions and responses by calling at least one specific objective task subroutine and passing information required by the objective task subroutine to indicated locations;

d) a main menu means for programs of a common class that offers three input options, namely sequential input means using a switching means which comprises means for indicating the end of the sequential input means, computer guided random order symbolic-numeric input means, and free symbolic-numeric input means;

e) a collection of CAE objective task programs stored in the system in the form of building blocks at user's disposal which can be used separately to do one task at a time, or combinatively to do one task after another until all are done;

f) means for performing parametric study, also called domain analysis on at least one computational method by performing a plurality of executions of the computational method with input data generated by automation, with ranges, parameters, and goals all under user's control, and sending the output data to a graphical output device wherein for the computational method a determination of parametric/domain's effect caused by algorithm dependent digital computational nature is made and is without uncertainty of possible human errors;

g) means for performing other much simple or more advanced automation in form of added tasks or through users own free experimentation of new communication power and session log file convenience, unlimited new algorithms of automation can be readily generated this way, such that in principle with such tool no one need to duplicate the exactly same manual session twice.

2. The system according to claim 1 wherein the determining of the relative degree of validity is performed for plural programs by comparing output of a plurality of computational programs.

3. The system according to claim 1 wherein the roles of exercising user's reasonable doubts against spurious solutions and actively pursing better analytical understanding and/or efficiencies are critically enhanced and richly rewarded.

4. The system according to claims 1 or 2, or 3 wherein the roles of users to supervise computer for safety and user's responsibility can be trained for all level of students and workers at least once for a life time if computer age is to derive the correct incentive and a consensus which recognizes that not all computer results are the same, not all programs are the same, and those good ideas which can be used by mankind once and forever are not worth nothing vice versa.

5. The method according to claim 1 wherein the method allows users to intervene or interrupt processes and adjust parameters, during the usage of automated objective tasks with flexibility such that, at important strategic levels, this human involvement won't become a burden of adding inefficiency at best, or providing an excuse for "to err is human" at worst; but rather, such intervention forms a means of exercising power of human skill, creativity, and judgement to guide computer processes in solving real world problems, as well as nurturing all these qualities to enable humans to become both less replaceable by automated machines, and far more immune to computer age syndromes like: engineering fiascos and garbage in garbage out at tremendous speed.

* * * * *